(12) United States Patent
Muro et al.

(10) Patent No.: US 10,641,935 B2
(45) Date of Patent: May 5, 2020

(54) COLORING COMPOSITION, COLOR FILTER, PATTERN FORMING METHOD, SOLID-STATE IMAGING DEVICE, AND IMAGE DISPLAY DEVICE

(71) Applicant: FUJIFILM Corporation, Tokyo (JP)

(72) Inventors: Naotsugu Muro, Shizuoka (JP); Seongmu Bak, Shizuoka (JP); Akiko Yoshii, Shizuoka (JP); Yoshinori Taguchi, Shizuoka (JP); Yousuke Murakami, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 151 days.

(21) Appl. No.: 15/970,087

(22) Filed: May 3, 2018

(65) Prior Publication Data

US 2018/0252852 A1 Sep. 6, 2018

Related U.S. Application Data

(63) Continuation of application No. PCT/JP2016/083023, filed on Nov. 8, 2016.

(30) Foreign Application Priority Data

Nov. 10, 2015 (JP) ................................. 2015-220391

(51) Int. Cl.
| | | |
|---|---|---|
| G02B 5/20 | (2006.01) | |
| G03F 7/004 | (2006.01) | |
| G02B 5/22 | (2006.01) | |
| G03F 7/027 | (2006.01) | |
| C09B 67/22 | (2006.01) | |
| G03F 7/031 | (2006.01) | |
| G03F 7/00 | (2006.01) | |
| G03F 7/029 | (2006.01) | |
| G03F 7/105 | (2006.01) | |
| C09B 23/00 | (2006.01) | |
| C09B 25/00 | (2006.01) | |
| C09B 45/00 | (2006.01) | |

(52) U.S. Cl.
CPC .............. *G02B 5/223* (2013.01); *C09B 23/00* (2013.01); *C09B 25/00* (2013.01); *C09B 45/00* (2013.01); *C09B 67/0033* (2013.01); *C09B 67/0041* (2013.01); *G03F 7/0007* (2013.01); *G03F 7/027* (2013.01); *G03F 7/029* (2013.01); *G03F 7/031* (2013.01); *G03F 7/105* (2013.01)

(58) Field of Classification Search
CPC ........ G03F 7/0007; G03F 7/004; G03F 7/027; G03F 7/031; G03F 7/105; G02B 5/223; G02F 1/133514; G02F 1/133416; H01L 27/14618
USPC ........ 430/7, 270.1, 281.1; 349/106; 252/586
See application file for complete search history.

(56) References Cited

U.S. PATENT DOCUMENTS 6,613,488 B1 9/2003 Nakamura et al.
2016/0326348 A1 11/2016 Aoyagi
2017/0299961 A1* 10/2017 Sakamoto ............... C09B 47/10
(Continued)

FOREIGN PATENT DOCUMENTS

| JP | 2001-109177 A | 4/2001 |
|---|---|---|
| JP | 2007-284590 A | 11/2007 |
| JP | 2011-144269 A | 7/2011 |

(Continued)

OTHER PUBLICATIONS

Office Action dated May 28, 2019 from the Japanese Patent Office in counterpart JP Application No. 2017-550322.

(Continued)

*Primary Examiner* — John A McPherson

(74) *Attorney, Agent, or Firm* — Sughrue Mion, PLLC

(57) ABSTRACT

Provided are a coloring composition capable of producing a film having fewer defects generated, and the like even in a case where the coloring composition is stored for a long period of time in an environment with variations in temperature, a color filter, a pattern forming method, a solid-state imaging device, and an image display device. The coloring composition includes a heterocycle-containing coloring agent such as a compound represented by Formula (1), a phthalimide compound, a solvent, and a resin. In Formula (1), $R^1$ to $R^{13}$ each independently represent a hydrogen atom or a substituent, and adjacent groups of $R^1$ to $R^8$ may be bonded to each other to form a ring, provided that at least one of the pairs of adjacent two groups of $R^1$ to $R^8$ is bonded to each other to form an aromatic ring.

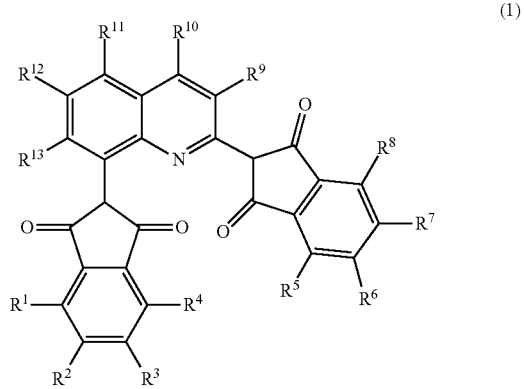

(1)

10 Claims, No Drawings

(56) References Cited

U.S. PATENT DOCUMENTS

2018/0095205 A1* 4/2018 Yamada .................. G02B 5/20

FOREIGN PATENT DOCUMENTS

| | | |
|---|---|---|
| JP | 2011-145540 A | 7/2011 |
| JP | 2011-157511 A | 8/2011 |
| JP | 2011-184493 A | 9/2011 |
| JP | 2012-158649 A | 8/2012 |
| JP | 2013-053226 A | 3/2013 |
| JP | 2013-54339 A | 3/2013 |
| JP | 2013-101166 A | 5/2013 |
| JP | 2014-25010 A | 2/2014 |
| JP | 2014-26228 A | 2/2014 |
| JP | 2015-072440 A | 4/2015 |
| JP | 2015-124378 A | 7/2015 |
| JP | 2015-145951 A | 8/2015 |
| JP | 2015-151467 A | 8/2015 |
| KR | 10-1311941 B1 | 9/2013 |
| TW | 201533115 A | 9/2015 |
| WO | 2012/066772 A1 | 5/2012 |
| WO | 2014/027550 A1 | 2/2014 |
| WO | 2014/069416 A1 | 5/2014 |
| WO | WO 2015/015961 A1 * | 2/2015 |
| WO | 2015/122286 A1 | 8/2015 |

OTHER PUBLICATIONS

Office Action dated Jul. 5, 2019, issued by the Korean Intellectual Property Office in corresponding Korean application No. 10-2018-7012066.

Translation of Written Opinion dated Dec. 6, 2016, issued by the International Bureau in counterpart Application No. PCT/JP2016/083023.

International Preliminary Report on Patentability with a Translation of Written Opinion issued from the International Bureau in counterpart International Application No. PCT/JP2016/083023, dated May 15, 2018.

International Search Report for PCT/JP2016/083023 dated Dec. 6, 2016 [PCT/ISA/210].

Office Action dated Jan. 31, 2020, from the Taiwanese Intellectual Property Office in Taiwan application No. 105134465.

* cited by examiner

COLORING COMPOSITION, COLOR FILTER, PATTERN FORMING METHOD, SOLID-STATE IMAGING DEVICE, AND IMAGE DISPLAY DEVICE

CROSS-REFERENCE TO RELATED APPLICATIONS

This application is a Continuation of PCT International Application No. PCT/JP2016/083023 filed on Nov. 8, 2016, which claims priority under 35 U.S.C § 119(a) to Japanese Patent Application No. 2015-220391 filed on Nov. 10, 2015. Each of the above application(s) is hereby expressly incorporated by reference, in its entirety, into the present application.

BACKGROUND OF THE INVENTION

1. Field of the Invention

The present invention relates to a coloring composition. It further relates to a color filter, a pattern forming method, a solid-state imaging device, and an image display device, each using the coloring composition.

2. Description of the Related Art

In recent years, as a digital camera, a mobile phone with a camera, and the like have been further spreading, there has been an increasing demand for a solid-state imaging device such as a charge coupled device (CCD) image sensor. A color filter has been used as a key device in a display or optical element.

For example, as a yellow coloring agent, there are a quinophthalone compound, an azo compound, a thiazole compound, a methane compound, and the like. In JP2013-54339A, JP2014-26228A, JP2011-184493A, JP2011-145540A, JP2012-158649A, and JP2014-25010A, a coloring composition using a yellow coloring agent is described.

On the other hand, in JP2015-151467A, JP2007-284590A, and KR10-1311941B, it is described that a green color filter is prepared using a coloring composition including a halogenated phthalocyanine pigment and tetrabromophthalimide.

SUMMARY OF THE INVENTION

The coloring composition including a resin, a coloring agent, and a solvent as described above may be used after being stored for a long period of time in some cases. With regard to the storage of the coloring composition, the coloring composition may be stored under conditions which have been subjected to temperature management in some cases, but the coloring composition may also be stored in an environment with variations in temperature without a temperature management in other cases. According to the studies conducted by the present inventors, it has been found that in a case where a film is produced after a coloring composition including a heterocycle-containing coloring agent including a nitrogen atom has been stored for a long period of time, defects are likely to be generated in the film. It has also been found that in a case where the coloring composition is stored for a long period of time, particularly in an environment with variations in temperature, defects are easily generated.

On the other hand, in JP2013-54339A, JP2014-26228A, JP2011-184493A, JP2011-145540A, JP2012-158649A, JP2014-25010A, JP2015-151467A, JP2007-284590A, and KR10-1311941B, there have been no studies on defects in a case of using a coloring composition after being stored for a long period of time.

Therefore, an object of the present invention is to provide a coloring composition capable of producing a film having fewer defects generated, and the like even in a case where the coloring composition is stored for a long period of time in an environment with variations in temperature, a color filter, a pattern forming method, a solid-state imaging device, and an image display device.

The present inventors have conducted extensive studies, and have thus found that a coloring composition is capable of producing a film having fewer defects generated even in a case where the coloring composition is stored for a long period of time, by using compounds represented by Formulae (1) to (4) which will be described later in combination with a phthalimide compound, thereby completing the present invention. The present invention provides the following aspects.

<1> A coloring composition comprising:
a heterocycle-containing coloring agent including a nitrogen atom;
a phthalimide compound;
a solvent; and
a resin,
in which the heterocycle-containing coloring agent is at least one selected from Formulae (1) to (4),

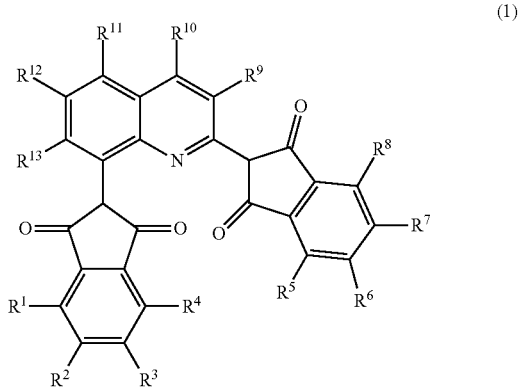

(1)

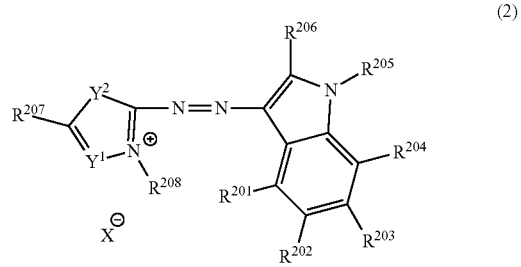

(2)

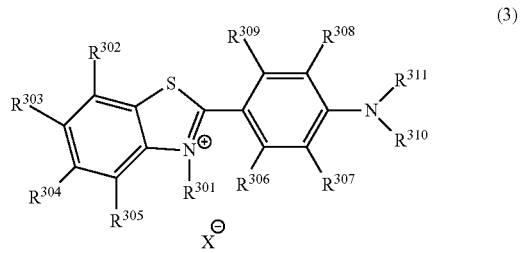

(3)

(4)

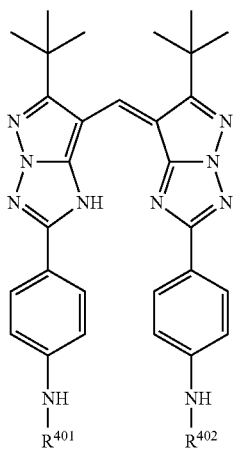

in Formula (1), $R^1$ to $R^{13}$ each independently represent a hydrogen atom or a substituent, and adjacent groups of $R^1$ to $R^8$ may be bonded to each other to form a ring, provided that at least one of the pairs of adjacent two groups of $R^1$ to $R^8$ is bonded to each other to form an aromatic ring;

in Formula (2), $R^{205}$ and $R^{208}$ each independently represent a hydrogen atom, an alkyl group, an aryl group, or a heteroaryl group, $R^{201}$ to $R^{204}$, $R^{206}$, and $R^{207}$ each independently represent a hydrogen atom or a substituent, $Y^1$ represents a nitrogen atom or —$CR^{Y1}$—, $Y^2$ represents a sulfur atom or —$NR^{Y2}$—, $R^{Y1}$ and $R^{Y2}$ each independently represent a hydrogen atom, an alkyl group, an aryl group, or a heteroaryl group, and X represents a bis(sulfonyl)imide anion, a tris(sulfonyl)methide anion, or an anion having a boron atom;

in Formula (3), $R^{301}$, $R^{311}$, and $R^{310}$ each independently represent a hydrogen atom, an alkyl group, an aryl group, or a heteroaryl group, and $R^{302}$ to $R^{305}$, and $R^{306}$ to $R^{509}$ each independently represent a hydrogen atom or a substituent, and X represents a bis(sulfonyl)imide anion, a tris(sulfonyl) methide anion, or an anion having a boron atom; and in Formula (4), $R^{401}$ and $R^{402}$ each independently represent $SO_2R^{403}$ or $COR^{403}$, and $R^{403}$ represents an alkyl group, an aryl group, or a heteroaryl group.

<2> The coloring composition as described in <1>, in which the phthalimide compound is a compound represented by Formula (PI),

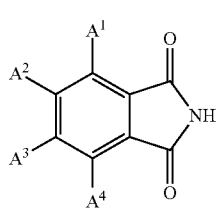

(PI)

in Formula (PI), $A^1$ to $A^4$ each independently represent a hydrogen atom, a halogen atom, or an alkyl group.

<3> The coloring composition as described in <2>, in which for the phthalimide compound, at least one of $A^1$, . . . , or $A^4$ in Formula (PI) is a bromine atom.

<4> The coloring composition as described in any one of <1> to <3>, in which the phthalimide compound is contained in the proportion of 0.001 to 6.0 parts by mass with respect to 100 parts by mass of the total amount of the compounds represented by Formulae (1) to (4).

<5> The coloring composition as described in any one of <1> to <4>, further comprising a curable compound.

<6> The coloring composition as described in <5>, further comprising a photopolymerization initiator, in which the curable compound includes a radically polymerizable compound.

<7> A color filter using the coloring composition as described in any one of <1> to <6>.

<8> A pattern forming method comprising:

forming a coloring composition layer on a support using the coloring composition as described in any one of <1> to <6>; and forming a pattern onto the coloring composition layer by a photolithographic method or a dry etching method.

<9> A solid-state imaging device comprising the color filter as described in <7>.

<10> An image display device comprising the color filter as described in <7>.

According to the present invention, it is possible to provide a coloring composition capable of producing a film having fewer defects generated, and the like even in a case where the coloring composition is stored for a long period of time in an environment with variations in temperature, a color filter, a pattern forming method, a solid-state imaging device, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, light means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure by a mercury lamp, far ultraviolet rays typified by an excimer laser, X-rays, EUV light, or the like, but also writing by particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a coloring composition.

In the present specification, "(meth)acrylate" represents either or both of acrylate and methacrylate, "(meth)acryl" represents either or both of acryl and methacryl, "(meth) allyl" represents either or both of allyl and methallyl, and "(meth)acryloyl" represents either or both of acryloyl and methacryloyl.

In the present specification, a term "step" includes not only an independent step, but also a step which is not clearly distinguished from other steps in a case where an intended action of the step is obtained.

In the present specification, a weight-average molecular weight (Mw) and a number-average molecular weight (Mn) are defined as values in terms of polystyrene by means of gel permeation chromatography (GPC) measurement.

In the present invention, a pigment means an insoluble compound which is sparingly soluble in a specific solvent. It typically means a compound which exists in a state where it is dispersed as particles in a composition. Here, examples of the solvent include the solvents exemplified in the section of a solvent which will be described later.

<Coloring Composition>

The coloring composition of the present invention includes at least one compound selected from Formulae (1) to (4) which will be described later, a phthalimide compound, a solvent, and a resin.

In a case where a coloring composition including compounds represented by Formulae (1) to (4) which will be described later, a solvent, and a resin, and not including a phthalimide compound is stored for a long period of time in an environment with variations in temperature, defects are generated in some cases, but a film having fewer defects generated, or the like can be produced even in a case the coloring composition is stored for a long period of time in an environment with variations in temperature by further incorporating a phthalimide compound into the coloring composition. A mechanism by which such the effect is obtained is presumed to be as follows.

That is, in a case where the compounds represented by Formulae (1) to (4) are pigments having a low solubility in a solvent, or the like, it is thought that the temperature of a coloring composition during storage is lowered (a low-temperature state), the compounds are aggregated and precipitated. In a case where the temperature of the coloring composition rises from the low-temperature state, some of the precipitated compounds are returned into a dispersion state, but the precipitates which remain without being dispersed become nuclei cause precipitation of the compounds in the low-temperature state, leading to growth of the nuclei. In a case where a film is produced using a coloring composition including such nuclei or the like, the solvent is removed during drying, and therefore, these nuclei accelerate the crystallization of the compounds to generate defects in the film in some cases.

The coloring composition of the present invention further includes a phthalimide compound, in addition to the compounds represented by Formulae (1) to (4). The phthalimide compound is considered to easily interact with the compounds represented by Formulae (1) to (4), and the phthalimide compound is adsorbed on the surface of the compounds represented by Formulae (1) to (4) to suppress the precipitation of the compound due to a temperature variation during the storage, which is presumed to make it possible to produce a film having fewer defects generated, or the like.

Moreover, in a case of a dye that tends to have a high solubility of the compounds represented by Formulae (1) to (4) in a solvent, or the like, the temperature of the coloring composition during storage is lowered (a low-temperature state), the solubility of compounds is lowered and the nuclei derived from the compounds represented by Formulae (1) to (4) are generated in some cases. In a case where the temperature of the coloring composition rises from the low-temperature state, the nuclei are dissolved in the solvent or the like in the coloring composition, but some of the nuclei remain without being dissolved in some cases. It is thought that the nuclei remaining without being dissolved cause precipitation of the compounds in the low-temperature state, leading to the growth of the nuclei. In a case where a film is produced using a coloring composition including such nuclei and the like, the solvent is removed during drying to generate the precipitation (crystallization) of the compounds around the nuclei, and as a result, defects are generated in the obtained film in some cases.

Since the coloring composition of the present invention includes, in addition to the compounds represented by Formulae (1) to (4), the phthalimide compound, the compounds represented by Formulae (1) to (4) can interact with the phthalimide compound to suppress the crystallization of the compounds represented by Formulae (1) to (4), which is presumed to make it possible to produce a film having fewer defects generated, or the like.

In addition, in a case where a coating film is prepared using a coloring composition including the compound represented by Formula (1), and then stored in the state of being uncured without performing a curing treatment or the like (being delayed and left to stand), foreign matters and the like are generated in the coating film in some cases. However, generation of foreign matters can be suppressed by using the compound represented by Formula (1) in combination with the phthalimide compound, and delaying and leaving the coating film to stand over a long period of time. This is presumed to be caused by the stabilization of its state in the coating film by the addition of the phthalimide compound.

Hereinafter, the coloring composition of the present invention will be described in detail.

<<Heterocycle-Containing Coloring Agent>>

The coloring composition of the present invention includes at least one compound (heterocycle-containing coloring agent) selected from Formulae (1) to (4). The compounds of Formulae (1) to (4) can be preferably used as a yellow coloring agent. In the present invention, the heterocycle-containing coloring agent is preferably the compound represented by Formula (1). According to this aspect, a film having fewer defects is more easily produced. Hereinafter, the compound represented by Formula (1), the compound represented by Formula (2), the compound represented by Formula (3), and the compound represented by Formula (4) are referred to as the compound (1), the compound (2), the compound (3), and the compound (4) respectively.

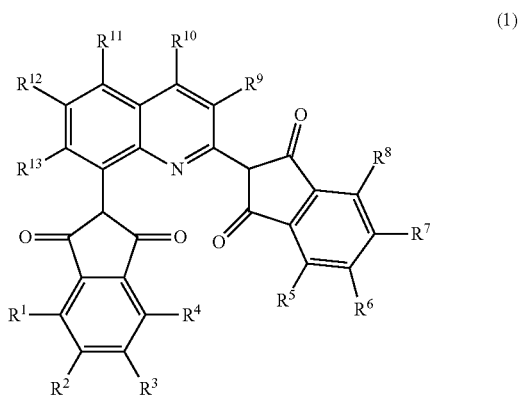

(1)

-continued

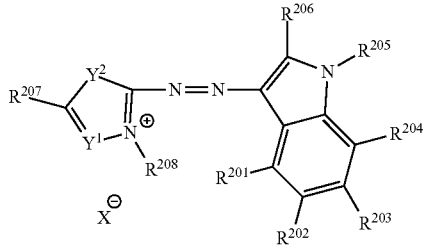
(2)

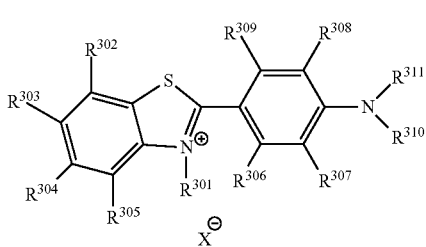
(3)

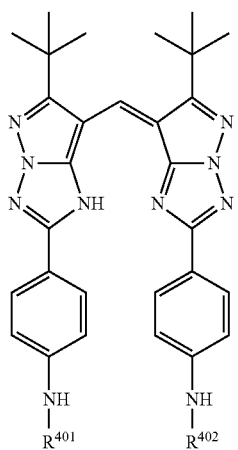
(4)

In Formula (1), $R^1$ to $R^{13}$ each independently represent a hydrogen atom or a substituent, and adjacent groups of $R^1$ to $R^8$ may be bonded to each other to form a ring, provided that at least one of the pairs of adjacent two groups of $R^1$ to $R^8$ is bonded to each other to form an aromatic ring.

In Formula (2), $R^{205}$ and $R^{208}$ each independently represent a hydrogen atom, an alkyl group, an aryl group, or a heteroaryl group, $R^{201}$ to $R^{204}$, $R^{206}$, and $R^{207}$ each independently represent a hydrogen atom or a substituent, $Y^1$ represents a nitrogen atom or —$CR^{Y1}$—, $Y^2$ represents a sulfur atom or —$NR^{Y2}$—, $R^{Y1}$ and $R^{Y2}$ each independently represent a hydrogen atom, an alkyl group, an aryl group, or a heteroaryl group, and X represents a bis(sulfonyl)imide anion, a tris(sulfonyl)methide anion, or an anion having a boron atom.

In Formula (3), $R^{301}$, $R^{311}$, and $R^{310}$ each independently represent a hydrogen atom, an alkyl group, an aryl group, or a heteroaryl group, $R^{302}$ to $R^{305}$, and $R^{306}$ to $R^{309}$ each independently represent a hydrogen atom or a substituent, and X represents a bis(sulfonyl)imide anion, a tris(sulfonyl) methide anion, or an anion having a boron atom.

In Formula (4), $R^{401}$ and $R^{402}$ each independently represent $SO_2R^{403}$ or $COR^{403}$; and $R^{403}$ represents an alkyl group, an aryl group, or a heteroaryl group.

(Compound (1))

In Formula (1), $R^1$ to $R^{13}$ each independently represent a hydrogen atom or a substituent. Examples of the substituent include the groups described in the substituent group T which will be described later, and the substituent is preferably a halogen atom, an alkyl group, an alkoxy group, an aryl group, a heteroaryl group, a sulfo group, a carboxyl group, a metal salt of a sulfo group, a metal salt of a carboxyl group, an alkylammonium salt of a sulfo group, an alkylammonium salt of a carboxyl group, a phthalimidemethyl group, or a sulfamoyl group, and more preferably a halogen atom. Examples of the halogen atom include a fluorine atom, a chlorine atom, a bromine atom, and an iodine atom, with the chlorine atom or the bromine atom being preferable.

In Formula (1), $R^9$ to $R^{13}$ are each preferably a hydrogen atom. Further, $R^1$ to $R^8$ are each preferably a hydrogen atom or a substituent. In addition, at least one of $R^1$, . . . , or $R^8$ is preferably a halogen atom.

In Formula (1), adjacent groups of $R^1$ to $R^8$ may be bonded to each other to form a ring, provided that at least one of the pairs of adjacent two groups of $R^1$ to $R^8$ is bonded to each other to form an aromatic ring. Examples of the ring formed by the bonding of adjacent groups of $R^1$ to $R^8$ include an alicycle (non-aromatic hydrocarbon ring), an aromatic ring, and a heterocycle. The ring may be monocyclic or polycyclic. The ring is preferably an aromatic ring. Examples of the aromatic ring include a hydrocarbon aromatic ring and a heterocyclic aromatic ring. Examples of the hydrocarbon aromatic ring include a benzene ring, a naphthalene ring, an anthracene ring, and a phenanthrene ring. Examples of the heterocyclic aromatic ring include a pyridine ring, a pyrazine ring, a pyrrole ring, a quinoline ring, a quinoxaline ring, a furan ring, a benzofuran ring, a thiophene ring, a benzothiophene ring, an oxazole ring, a thiazole ring, an imidazole ring, a pyrazole ring, an indole ring, and a carbazole ring. The aromatic ring is preferably a hydrocarbon aromatic ring, and more preferably a benzene ring.

The compound (1) is preferably a compound represented by any one of Formulae (1a) to (1c).

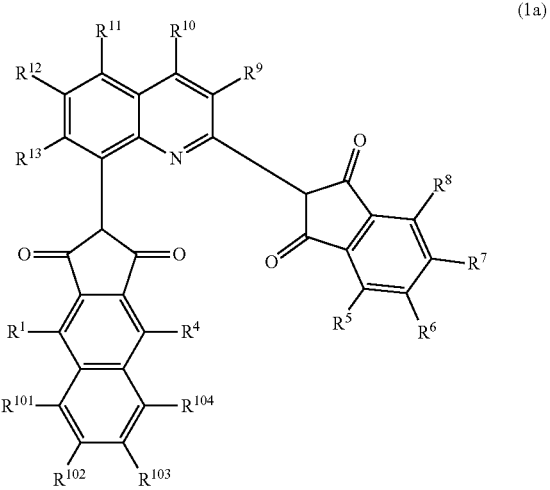
(1a)

-continued (1b)

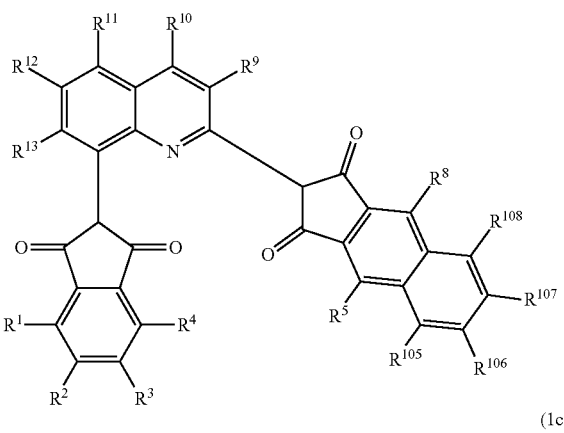

(1c)

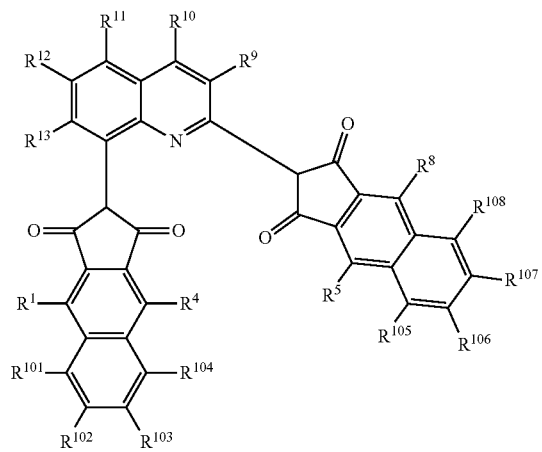

In Formulae (1a) to (1c), $R^1$ to $R^{13}$, and $R^{10}$ to $R^{108}$ each independently represent a hydrogen atom or a substituent.

Examples of the substituent represented by $R^1$ to $R^{13}$, and $R^{101}$ to $R^{108}$ in Formulae (1a) to (1c) include the groups described in the substituent group T which will be described later, and examples of the substituent include a halogen atom, an alkyl group, an alkoxy group, an aryl group, a heteroaryl group, a sulfo group, a carboxyl group, a metal salt of a sulfo group, a metal salt of a carboxyl group, an alkylammonium salt of a sulfo group, an alkylammonium salt of a carboxyl group, a phthalimidemethyl group, or a sulfamoyl group, and more preferably a halogen atom.

It is preferable that at least one of $R^9$, ..., or $R^{13}$ in Formulae (1a) to (1c) is a hydrogen atom, and it is more preferable that all of $R^9$ to $R^{13}$ in Formulae (1a) to (1c) are hydrogen atoms.

$R^1$ to $R^8$, and $R^{101}$ to $R^{108}$ of in Formulae (1a) to (1c) are each independently preferably a hydrogen atom or a halogen atom.

Preferred aspects of the compound (1) include <1> to <3> below.

<1> An aspect in which in Formula (1a), at least one of $R^9$, ..., or $R^{13}$ is a hydrogen atom, at least one of $R^1$, $R^4$, $R^{101}$, ..., or $R^{104}$ is a hydrogen atom, and at least one of $R^5$, ..., or $R^8$ is a halogen atom. More preferably, an aspect in which in Formula (1a), $R^9$ to $R^{13}$ are hydrogen atoms, $R^1$, $R^4$, and $R^{101}$ to $R^{104}$ are hydrogen atoms, and $R^5$ to $R^8$ are halogen atoms.

<2> An aspect in which in Formula (1b), at least one of $R^9$, ..., or $R^{13}$ is a hydrogen atom, at least one of $R^1$, ..., or $R^4$ is a halogen atom, and at least one of $R^5$, $R^8$, $R^{105}$, ..., or $R^{108}$ is a hydrogen atom. More preferably, an aspect in Formula (1b), $R^9$ to $R^{13}$ are hydrogen atoms, $R^1$ to $R^4$ are halogen atoms, and $R^5$, $R^8$, $R^{105}$, ..., or $R^{108}$ are hydrogen atoms.

<3> An aspect in which in Formula (1c), at least one of $R^9$, ..., or $R^{13}$ is a hydrogen atom, at least one of $R^1$, $R^4$, $R^{101}$, ..., or $R^{104}$ is a hydrogen atom, and at least one of $R^5$, $R^8$, $R^{105}$, ..., or $R^{108}$ is a hydrogen atom. More preferably, an aspect in which in Formula (1c), $R^1$ to $R^{13}$ and $R^{101}$ to $R^{108}$ are hydrogen atoms.

Specific examples of the compound (1) include the following compounds. Other examples thereof include the compounds described in paragraphs 0033 to 0034 of JP2013-54339A and the compounds described in paragraphs 0049 to 0051 of JP2014-26228A, the contents of which are incorporated herein by reference.

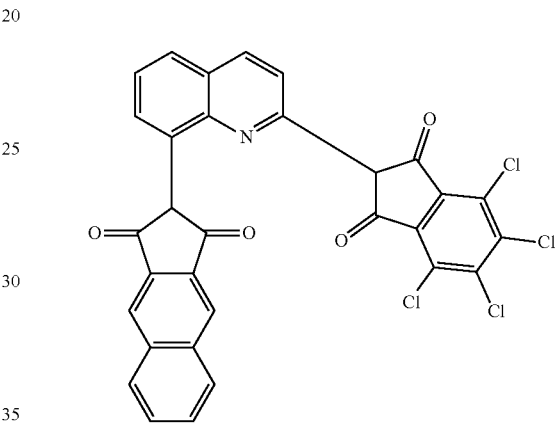

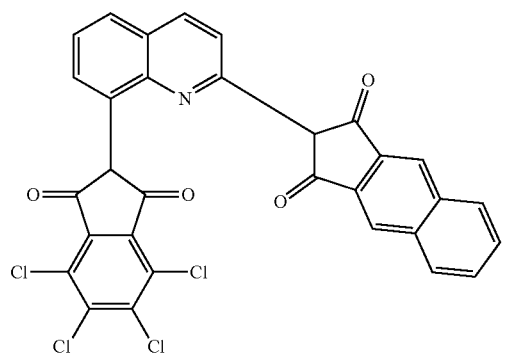

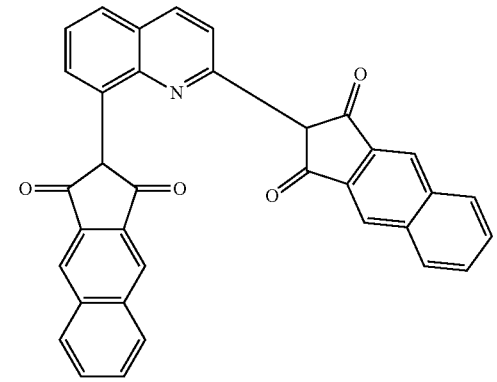

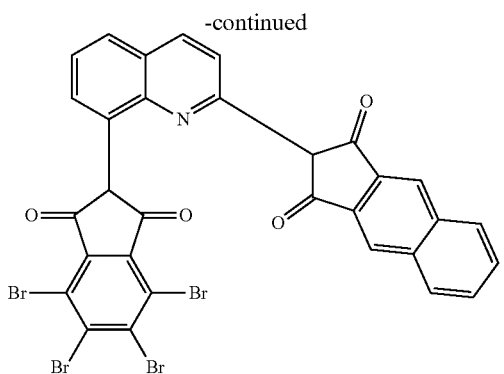

(Compound (2))

In Formula (2), $R^{205}$ and $R^{208}$ each independently represent a hydrogen atom, an alkyl group, an aryl group, or a heteroaryl group, and are preferably a hydrogen atom or an alkyl group, and more preferably an alkyl group. The alkyl group, the aryl group, and the heteroaryl group may be an unsubstituted alkyl group, an unsubstituted aryl group, and an unsubstituted heteroaryl group, and may further have a substituent. Examples of the substituent include the groups described in the substituent group T which will be described later.

The number of carbon atoms in the alkyl group is preferably 1 to 20, more preferably 1 to 10, and still more preferably 1 to 3. The alkyl group may be linear, branched, or cyclic, and is preferably linear or branched.

The number of carbon atoms in the aryl group is preferably 6 to 30, more preferably 6 to 20, and still more preferably 6 to 12. The aryl group is preferably a phenyl group.

The heteroaryl group is preferably a monocycle or a fused ring, and is preferably a monocycle or a fused ring having 2 to 8 fusions, and more preferably a monocycle or a fused ring having 2 to 4 fusions. The number of heteroatoms constituting the ring of the heteroaryl group is preferably 1 to 3. The heteroatom constituting the ring of the heteroaryl group is preferably a nitrogen atom, an oxygen atom, or a sulfur atom. The heteroaryl group is preferably a 5- or 6-membered ring. The number of carbon atoms constituting a ring of the heteroaryl group is preferably 3 to 30, more preferably 3 to 18, and still more preferably 3 to 12.

In Formula (2), $R^{201}$ to $R^{204}$, $R^{206}$, and $R^{207}$ each independently represent a hydrogen atom or a substituent. Examples of the substituent include the groups described in the substituent group T which will be described later.

$R^{201}$ to $R^{204}$ are each independently preferably a hydrogen atom, an alkyl group, or a halogen atom, and more preferably a hydrogen atom. Examples of the alkyl group include the alkyl groups described as $R^{205}$ and $R^{208}$ as described above.

$R^{206}$ is preferably a hydrogen atom, an alkyl group, an aryl group, or a heteroaryl group, more preferably a hydrogen atom, an alkyl group, or an aryl group, an still more preferably an aryl group. Examples of the alkyl group, the aryl group, and the heteroaryl group include the alkyl groups, the aryl groups, and the heteroaryl groups described as $R^{205}$ and $R^{208}$ as described above.

$R^{207}$ is preferably a hydrogen atom or an alkyl group, and more preferably a hydrogen atom. Examples of the alkyl group include the alkyl groups described as $R^{205}$ and $R^{208}$.

In Formula (2), $Y^1$ represents a nitrogen atom or —$CR^{Y1}$—, $Y^2$ represents a sulfur atom or —$NR^{Y2}$—, and $R^{Y1}$ and $R^{Y2}$ each independently represent a hydrogen atom, an alkyl group, an aryl group, or a heteroaryl group. $R^{Y1}$ is preferably a hydrogen atom, an alkyl group, or an aryl group, more preferably a hydrogen atom or an alkyl group, and particularly preferably a hydrogen atom. $R^{Y2}$ is preferably a hydrogen atom, an alkyl group, or an aryl group, more preferably a hydrogen atom or an alkyl group, and still more preferably an alkyl group. Examples of the represented by $R^{Y1}$ and $R^{Y2}$ include the alkyl group, the aryl group, and the heteroaryl group the alkyl groups, the aryl groups, and the heteroaryl groups described as $R^{205}$ and $R^{208}$ as described above. Preferred aspects of a combination of $Y^1$ and $Y^2$ include <1> and <2> below.

<1> A combination in which $Y^1$ is a nitrogen atom and $Y^2$ is —$NR^{Y2}$.

<2> A combination in which $Y^1$ is —$CR^{Y1}$— and $Y^2$ is a sulfur atom.

In Formula (2), X represents a bis(sulfonyl)imide anion, a tris(sulfonyl)methide anion, or an anion having a boron atom. Examples of the bis(sulfonyl)imide anion include an anion represented by (AN-1), with the bis(trifluoromethanesulfonyl)imide anion being preferable. Examples of the tris(sulfonyl)methide anion include an anion represented by (AN-2), with the tris(trifluoromethanesulfonyl)methide anion being more preferable. Examples of the anion having a boron atom include a tetrafluoroborate anion, a tetraphenylborate anion, and a tetraperfluorophenylborate anion.

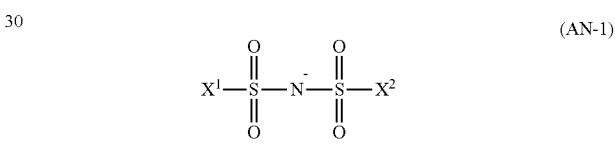

(AN-1)

In Formula (AN-1), $X^1$ and $X^2$ each independently represent a halogen atom or an alkyl group. $X^1$ and $X^2$ may be bonded to each other to form a ring.

The halogen atom represented by each of $X^1$ and $X^2$ is preferably a fluorine atom. The number of carbon atoms in the alkyl group represented by each of $X^1$ and $X^2$ is preferably 1 to 10, and more preferably 1 to 4. The alkyl group may be an unsubstituted alkyl group and may have a substituent. As the substituent, a halogen atom is preferable, and a fluorine atom is more preferable.

$X^1$ and $X^2$ are each independently preferably a fluorine atom or an alkyl group having a fluorine atom, and more preferably an alkyl group having a fluorine atom. The alkyl group having a fluorine atom is an alkyl group having 1 to 10 carbon atoms and a fluorine atom, more preferably a perfluoroalkyl group having 1 to 10 carbon atoms, still more preferably a perfluoroalkyl group having 1 to 4 carbon atoms, and particularly a trifluoromethyl group.

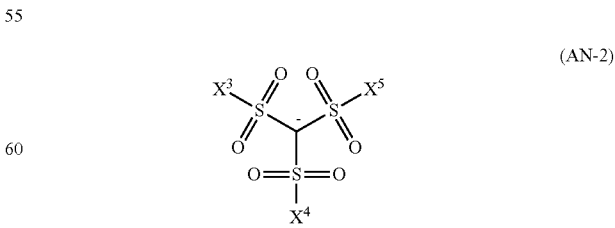

(AN-2)

In Formula (AN-2), $X^1$, $X^4$, and $X^5$ each independently represent a halogen atom or an alkyl group. The number of carbon atoms in the alkyl group represented by each of $X^3$, $X^4$ and $X^5$ is preferably 1 to 10, and more preferably 1 to 4. The alkyl group may be an unsubstituted alkyl group and may have a substituent. As the substituent, a halogen atom is preferable, and a fluorine atom is more preferable.

$X^1$, $X^4$, and $X^5$ are each independently preferably a fluorine atom or an alkyl group having a fluorine atom, and more preferably an alkyl group having a fluorine atom. The alkyl group having a fluorine atom is preferably an alkyl group having 1 to 10 carbon atoms and a fluorine atom, more preferably a perfluoroalkyl group having 1 to 10 carbon atoms, still more preferably a perfluoroalkyl group having 1 to 4 carbon atoms, and particularly preferably a trifluoromethyl group.

The mass of one molecule of the anion represented by X is preferably 100 to 1,000, and more preferably 200 to 500.

Specific examples of the anion are shown below, but the present invention is not limited thereto.

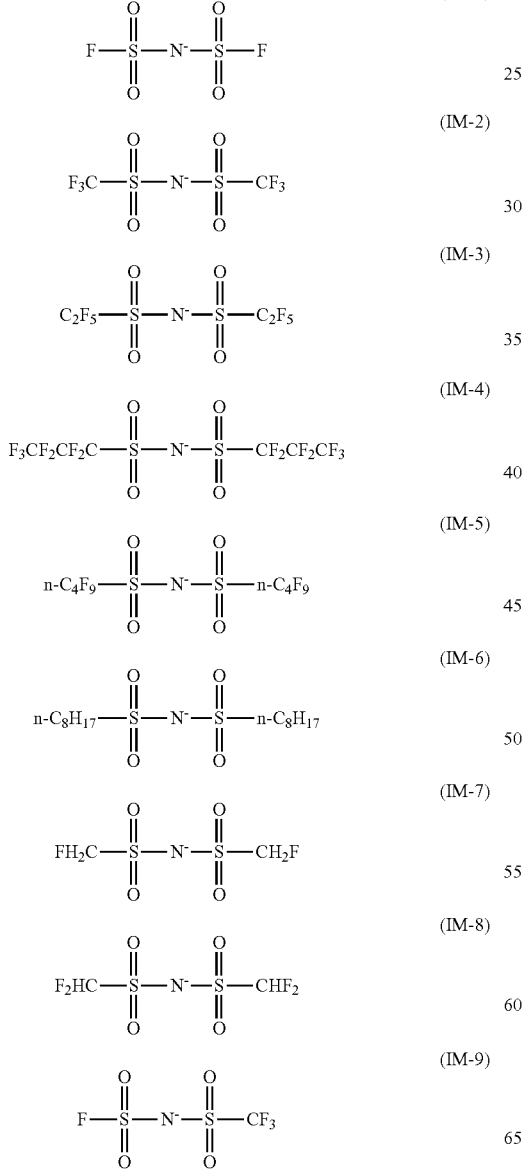

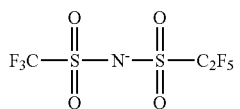

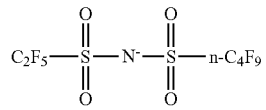

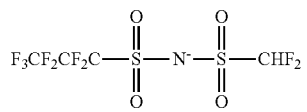

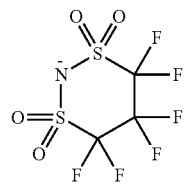

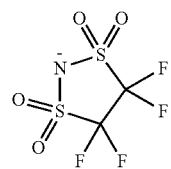

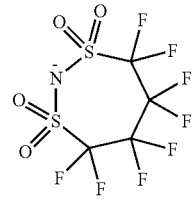

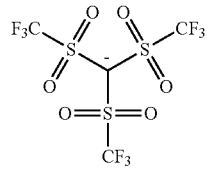

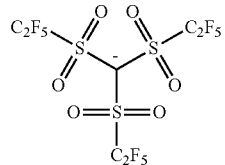

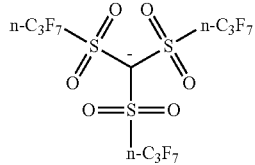

-continued

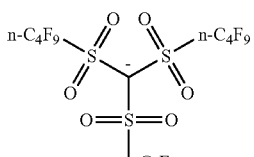
(MD-4)

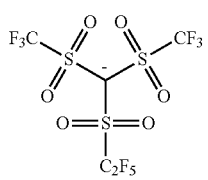
(MD-5)

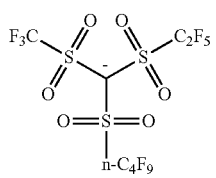
(MD-6)

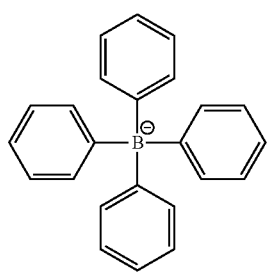

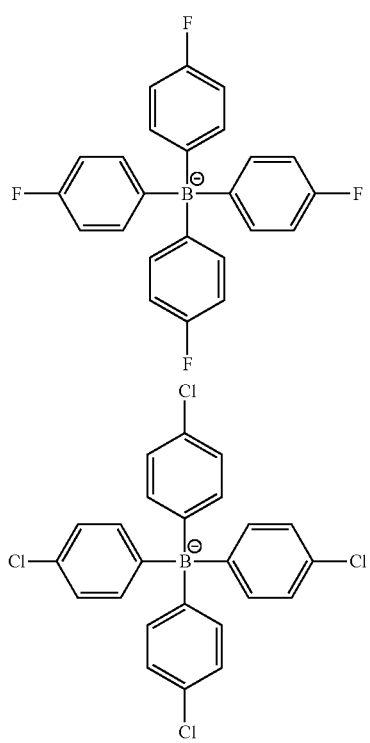

-continued

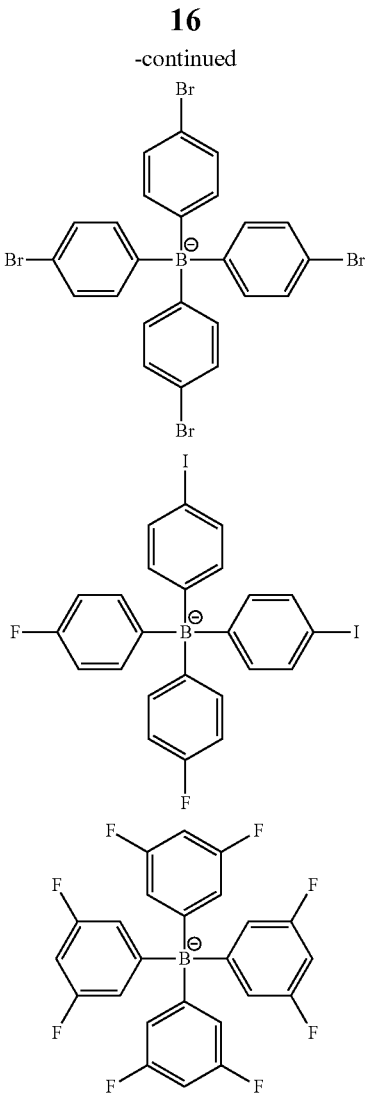

Specific examples of the compound (2) include the following compounds. Further, in the following compounds, X represents a bis(trifluoromethanesulfonyl)imide anion, a tris(trifluoromethanesulfonyl)methide anion, a tetrafluoroborate anion, a tetraphenylborate anion, or a tetraperfluorophenylborate anion. Further, specific examples of the compound (2) include the compounds described in paragraph 0025 of JP2011-184493A, the contents of which are incorporated herein by reference.

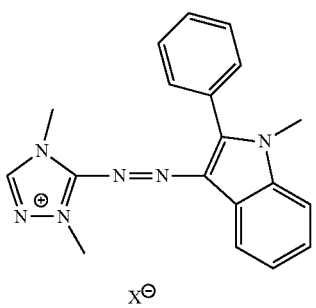
X⊖

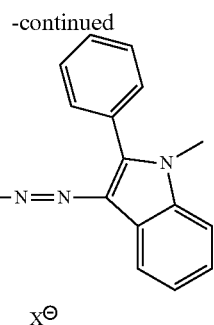

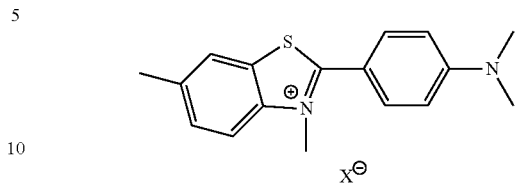

compound (3) include the compounds described in paragraph 0019 of JP2012-158649A, the contents of which are incorporated herein by reference.

(Compound (3))

In Formula (3), $R^{301}$, $R^{311}$, and $R^{310}$ each independently represent a hydrogen atom, an alkyl group, an aryl group, or a heteroaryl group, and are each preferably a hydrogen atom or an alkyl group, and more preferably an alkyl group. The alkyl group, the aryl group, and the heteroaryl group may be an unsubstituted alkyl group, an unsubstituted aryl group, and an unsubstituted heteroaryl group, and may further have a substituent. Examples of the substituent include the groups described in the substituent group T which will be described later.

The number of carbon atoms in the alkyl group is preferably 1 to 20, more preferably 1 to 10, and still more preferably 1 to 3. The alkyl group may be linear, branched, or cyclic, and is preferably linear or branched.

The number of carbon atoms in the aryl group is preferably 6 to 30, more preferably 6 to 20, and still more preferably 6 to 12. The aryl group is preferably a phenyl group.

The heteroaryl group is preferably a monocycle or a fused ring, preferably a monocycle or a fused ring having 2 to 8 fusions, and more preferably a monocycle or a fused ring having 2 to 4 fusions. The number of heteroatoms constituting the ring of the heteroaryl group is preferably 1 to 3. The heteroatom constituting the ring of the heteroaryl group is preferably a nitrogen atom, an oxygen atom, or a sulfur atom. The heteroaryl group is preferably a 5- or 6-membered ring. The number of carbon atoms constituting a ring of the heteroaryl group is preferably 3 to 30, more preferably 3 to 18, and still more preferably 3 to 12.

In Formula (3), $R^{302}$ to $R^{305}$, and $R^{306}$ to $R^{309}$ each independently represent a hydrogen atom or a substituent. Examples of the substituent include the groups described in the substituent group T which will be described later. Examples of the substituent include a halogen atom, an alkyl group, an alkoxy group, amino group, an acylamino group, a nitro group, an aryl group, and a hydroxyl group, with the alkyl group or the alkoxy group being preferable.

In Formula (3), $R^{302}$ and $R^{305}$ are each preferably a hydrogen atom. Further, $R^{303}$ and $R^{301}$ are each preferably a hydrogen atom or a substituent. In addition, $R^{306}$ to $R^{39}$ are each preferably a hydrogen atom.

In Formula (3), X represents a bis(sulfonyl)imide anion, a tris(sulfonyl)methide anion, or an anion having a boron atom. These have the same definitions as the anions described in Formula (2) as mentioned above, and preferred ranges thereof are also the same.

Specific examples of the compound (3) include the following compounds. Further, in the following compound, X represents a bis(trifluoromethanesulfonyl)imide anion, a (trifluoromethanesulfonyl)methide anion, a tetrafluoroborate anion, a tetraphenylborate anion, or a tetraperfluorophenylborate anion. In addition, specific examples of the (Compound (4))

In Formula (4), $R^{401}$ and $R^{402}$ each independently represent $SO_2R^{403}$ or $COR^{403}$, and $R^{403}$ represents an alkyl group, an aryl group, or a heteroaryl group. $R^{403}$ is preferably an alkyl group or an aryl group, and more preferably an alkyl group. The alkyl group, the aryl group, and the heteroaryl group represented by $R^{403}$ may be an unsubstituted alkyl group, an unsubstituted aryl group, and an unsubstituted heteroaryl group, and may further have a substituent. Examples of the substituent include the groups described in the substituent group T which will be described later. Examples thereof include a halogen atom, an alkyl group, an aryl group, an alkoxy group, an acyl group, an alkylcarbonyloxy group, an arylcarbonyloxy group, an alkoxycarbonyloxy group, an aryloxycarbonyloxy group, an alkylsulfonyl group, an arylsulfonyl group, an alkylsulfinyl group, and an arylsulfinyl group.

The number of carbon atoms in the alkyl group is preferably 4 to 18, more preferably 6 to 18, and still more preferably 6 to 12. The alkyl group may be linear, branched, or cyclic, and is preferably linear or branched. Specific examples of the alkyl group include a methyl group, an ethyl group, a propyl group, an isopropyl group, a butyl group, an isobutyl group, a pentyl group, a hexyl group, a cyclohexyl group, a heptyl group, a 3-heptyl group, an octyl group, a 2-ethylhexyl group, a nonyl group, a decyl group, an undecyl group, a dodecyl group, a tetradecyl group, a methoxyethoxyethyl group, and an ethoxycarbonylethyl group.

The number of carbon atoms in the aryl group is preferably 6 to 18, and more preferably 6 to 12. Specific examples of the aryl group include a phenyl group, a 2-methylphenyl group, a 4-ethoxycarbonylphenyl group, a 4-chlorophenyl group, and a 3-(2-ethylhexyloxycarbonyl)phenyl group.

The heteroaryl group is preferably a monocycle or a fused ring, a monocycle or a fused ring having 2 to 8 fusions, and more preferably a monocycle or a fused ring having 2 to 4 fusions. The number of heteroatoms constituting the ring of the heteroaryl group is preferably 1 to 3. The heteroatoms constituting the ring of the heteroaryl group is preferably a nitrogen atom, an oxygen atom, or a sulfur atom. The heteroaryl group is preferably a 5- or 6-membered ring. The number of carbon atoms constituting a ring of the heteroaryl group is preferably 3 to 30, more preferably 3 to 18, and still more preferably 3 to 12.

The compound (4) is preferably the compound in which at least one of $R^{401}$ or $R^{402}$ represents $SO_2R^{403}$, and more preferably the compound in which both of $R^{401}$ and $R^{402}$ represent $SO_2R^{403}$. Further, $R^{403}$ is preferably an alkyl group having 4 to 18 carbon atoms. In addition, $R^{401}$ and $R^{402}$ are preferably the same groups.

Specific examples of the compound (4) include the following compounds. Other examples thereof include the compounds described in paragraphs 0030 to 0032 of JP2014-25010A, the contents of which are incorporated herein by reference. The following compounds can be synthesized in accordance with, for example, the methods described in paragraphs 0036 to 0044 of JP2014-25010A.

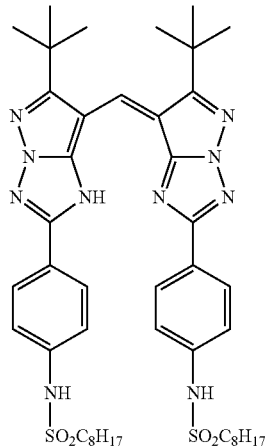

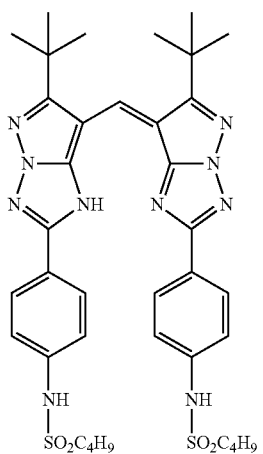

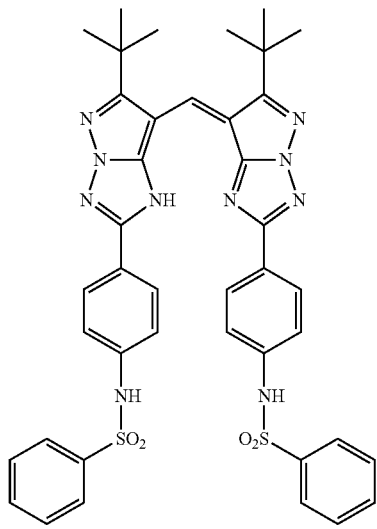

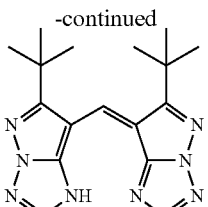

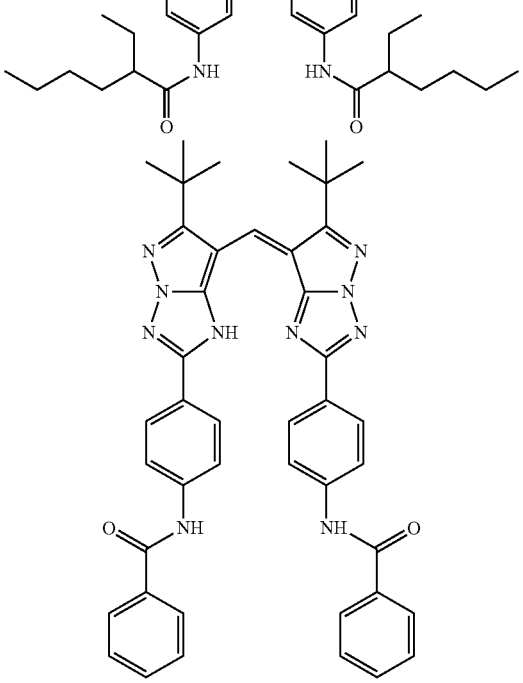

(Substituent Group T)

Examples of the substituent include:

a halogen atom (for example, a fluorine atom, a chlorine atom, a bromine atom, and an iodine atom);

a linear or branched alkyl group (a linear or branched, and substituted or unsubstituted alkyl group, and preferably an alkyl group having 1 to 30 carbon atoms, for example, methyl, ethyl, n-propyl, isopropyl, tert-butyl, n-octyl, 2-chloroethyl, 2-cyanoethyl, and 2-ethylhexyl);

a cycloalkyl group (preferably a substituted or unsubstituted cycloalkyl group having 3 to 30 carbon atoms, for example, cyclohexyl and cyclopentyl, or a polycycloalkyl group, for example, a group having a polycyclic structure such as a bicycloalkyl group (preferably a substituted or unsubstituted bicycloalkyl group having 5 to 30 carbon atoms, for example, a bicyclo[1,2,2]heptan-2-yl group, and a bicyclo[2,2,2]octan-3-yl group), and a tricycloalkyl group, with the monocyclic cycloalkyl group and the bicycloalkyl group being more preferable, and the monocyclic cycloalkyl group being particularly preferable);

a linear or branched alkenyl group (a linear or branched, and substituted or unsubstituted alkenyl group, which is preferably an alkenyl group having 2 to 30 carbon atoms, for example, vinyl, allyl, prenyl, geranyl, and oleyl);

a cycloalkenyl group (preferably a substituted or unsubstituted cycloalkenyl group having 3 to 30 carbon atoms, for example, 2-cyclopenten-1-yl and 2-cyclohexen-1-yl, or a polycyclic alkenyl group, for example, a bicycloalkenyl group (preferably a substituted or unsubstituted bicycloalkenyl group having 5 to 30 carbon atoms, for example, bicyclo[2,2,1]hepto-2-en-1-yl and bicyclo[2,2,2]octo-2-en-4-yl), or a tricycloalkenyl group, with the monocyclic cycloalkenyl group being particularly preferable);

an alkynyl group (preferably a substituted or unsubstituted alkynyl group having 2 to 30 carbon atoms, for example, an ethynyl group, a propargyl group, and a trimethylsilylethynyl group);

an aryl group (preferably a substituted or unsubstituted aryl group having 6 to 30 carbon atoms, for example, phenyl, p-tolyl, naphthyl, m-chlorophenyl, and o-hexadecanoylaminophenyl);

a heteroaryl group (preferably a substituted or unsubstituted, and monocyclic or ring-fused 5- to 7-membered heteroaryl group, more preferably a heteroaryl group of which ring-constituting atoms have at least one heteroatom selected from a carbon atom, an oxygen atom, a nitrogen atom, and a sulfur atom, and still more preferably a 5- or 6-membered heteroaryl group having 3 to 30 carbon atoms);

a cyano group;

a hydroxyl group;

a nitro group;

a carboxyl group (in which a hydrogen atom may be dissociated (that is, a carbonate group) or may be in a salt state (a metal salt (for example, a sodium salt, a potassium salt, a magnesium salt, a calcium salt, an iron salt, and an aluminum salt), an alkylammonium salt (for example, an ammonium salt of a long-chain monoalkyl amine such as octylamine, laurylamine, and stearylamine, and a quaternary alkylammonium salt such as a palmityltrimethylammonium salt, a dilauryldimethylammonium salt, and a distearyldimethylammonium salt)));

an alkoxy group (preferably a substituted or unsubstituted alkoxy group having 1 to 30 carbon atoms, for example, methoxy, ethoxy, isopropoxy, tert-butoxy, n-octyloxy, and 2-methoxyethoxy);

an aryloxy group (preferably a substituted or unsubstituted aryloxy group having 6 to 30 carbon atoms, for example, phenoxy, 2-methylphenoxy, 2,4-di-tert-amylphenoxy, 4-tert-butylphenoxy, 3-nitrophenoxy, and 2-tetradecanoylaminophenoxy);

a silyloxy group (preferably a silyloxy group having 3 to 20 carbon atoms, for example, trimethylsilyloxy and tert-butyldimethylsilyloxy);

a heteroaryloxy group (preferably a substituted or unsubstituted heteroaryloxy group having 2 to 30 carbon atoms, in which a heteroaryl moiety is preferably the heteroaryl moiety explained for the heteroaryl group described above, for example, 1-phenyltetrazol-5-oxy and 2-tetrahydropyranyloxy);

an acyloxy group (preferably a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, and p-methoxyphenylcarbonyloxy);

a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy);

an alkoxycarbonyloxy group (preferably a substituted or unsubstituted alkoxycarbonyloxy group having 2 to 30 carbon atoms, for example, methoxycarbonyloxy, ethoxycarbonyloxy, tert-butoxycarbonyloxy, and n-octylcarbonyloxy);

an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, and p-n-hexadecyloxyphenoxycarbonyloxy);

an amino group (including an alkylamino group, an arylamino group, and a heteroarylamino group, and being preferably an amino group, a substituted or unsubstituted alkylamino group having 1 to 30 carbon atoms, a substituted or unsubstituted arylamino group having 6 to 30 carbon atoms, and a heteroarylamino group having 0 to 30 carbon atoms, for example, amino, methylamino, dimethylamino, anilino, N-methyl-anilino, diphenylamino, and N-1,3,5-triazin-2-ylamino);

an acylamino group (preferably a substituted or unsubstituted alkylcarbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, and 3,4,5-tri-n-octyloxyphenyl carbonylamino); an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, and morpholinocarbonylamino);

an alkoxycarbonylamino group (preferably a substituted or unsubstituted alkoxycarbonylamino group having 2 to 30 carbon atoms, for example, methoxycarbonylamino, ethoxycarbonylamino, tert-butoxycarbonylamino, n-octadecyloxycarbonylamino, and N-methyl-methoxycarbonylamino);

an aryloxycarbonylamino group (preferably a substituted or unsubstituted aryloxycarbonylamino group having 7 to 30 carbon atoms, for example, phenoxycarbonylamino, p-chlorophenoxycarbonylamino, and m-n-octyloxyphenoxycarbonylamino);

a sulfamoylamino group (preferably a substituted or unsubstituted sulfamoylamino group having 0 to 30 carbon atoms, for example, sulfamoylamino, N,N-dimethylaminosulfonylamino, and N-n-octylaminosulfonylamino);

an alkylsulfonylamino or arylsulfonylamino group (preferably a substituted or unsubstituted alkylsulfonylamino group having 1 to 30 carbon atoms, or a substituted or unsubstituted arylsulfonylamino group having 6 to 30 carbon atoms, for example, methylsulfonylamino, butylsulfonylamino, phenylsulfonylamino, 2,3,5-trichlorophenylsulfonylamino, and p-methylphenylsulfonylamino);

a mercapto group;

an alkylthio group (preferably a substituted or unsubstituted alkylthio group having 1 to 30 carbon atoms, for example, methylthio, ethylthio, and n-hexadecylthio); an arylthio group (preferably a substituted or unsubstituted arylthio group having 6 to 30 carbon atoms, for example, phenylthio, p-chlorophenylthio, and m-methoxyphenylthio);

a heteroarylthio group (preferably a substituted or unsubstituted heteroarythio group having 2 to 30 carbon atoms, in which a heteroaryl moiety is preferably the heteroaryl moiety explained for the heteroaryl group described above, for example, 2-benzothiazolylthio and 1-phenyltetrazol-5-ylthio);

a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N—(N'-phenylcarbamoyl)sulfamoyl);

a sulfo group (in which a hydrogen atom may be dissociated (that is, a sulfonate group) or may be in a salt state (a metal salt (for example, a sodium salt, a potassium salt, a magnesium salt, a calcium salt, an iron salt, and an aluminum salt), an alkylammonium salt (for example, an ammonium salt of a long-chain monoalkyl amine such as octylamine, laurylamine, and stearylamine, and a quaternary alkylammonium salt such as a palmityltrimethylammonium salt, a dilauryldimethylammonium salt, and a distearyldimethylammonium salt)));

an alkylsulfinyl or arylsulfinyl group (preferably a substituted or unsubstituted alkylsulfinyl group having 1 to 30 carbon atoms or a substituted or unsubstituted arylsulfinyl group having 6 to 30 carbon atoms, for example, methylsulfinyl, ethylsulfinyl, phenylsulfinyl, and p-methylphenylsulfinyl);

an alkylsulfonyl or arylsulfonyl group (preferably a substituted or unsubstituted alkylsulfonyl group having 1 to 30 carbon atoms or a substituted or unsubstituted arylsulfonyl group having 6 to 30 carbon atoms, for example, methylsulfonyl, ethylsulfonyl, phenylsulfonyl, and p-methylphenylsulfonyl);

an acyl group (preferably a formyl group, a substituted or unsubstituted alkylcarbonyl group having 2 to 30 carbon atoms, or a substituted or unsubstituted arylcarbonyl group having 7 to 30 carbon atoms, for example, acetyl, pivaloyl, 2-chloroacetyl, stearoyl, benzoyl, and p-n-octyloxyphenylcarbonyl);

an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, and p-tert-butylphenoxycarbonyl);

an alkoxycarbonyl group (preferably a substituted or unsubstituted alkoxycarbonyl group having 2 to 30 carbon atoms, for example, methoxycarbonyl, ethoxycarbonyl, tert-butoxycarbonyl, and n-octadecyloxycarbonyl);

a carbamoyl group (preferably a substituted or unsubstituted carbamoyl group having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl);

an arylazo or heteroarylazo group (preferably a substituted or unsubstituted arylazo group having 6 to 30 carbon atoms, or a substituted or unsubstituted heteroarylazo group having 3 to 30 carbon atoms (in which a heteroaryl moiety is preferably the heteroaryl moiety explained for the heteroaryl group described above), for example, phenylazo, p-chlorophenylazo, and 5-ethylthio-1,3,4-thiadiazol-2-ylazo);

an imido group (preferably a substituted or unsubstituted imido group having 2 to 30 carbon atoms, for example, N-succinimide and N-phthalimide);

a phosphino group (preferably a substituted or unsubstituted phosphino group having 2 to 30 carbon atoms, for example, dimethylphosphino, diphenylphosphino, and methylphenoxyphosphino);

a phosphinyl group (preferably a substituted or unsubstituted phosphinyl group having 2 to 30 carbon atoms, for example, phosphinyl, dioctyloxyphosphinyl, and diethoxyphosphinyl);

a phosphinyloxy group (preferably a substituted or unsubstituted phosphinyloxy group having 2 to 30 carbon atoms, for example, diphenoxyphosphinyloxy and dioctyloxyphosphinyloxy);

a phosphinylamino group (preferably a substituted or unsubstituted phosphinylamino group having 2 to 30 carbon atoms, for example, dimethoxyphosphinylamino and dimethylaminophosphinylamino); and a silyl group (preferably a substituted or unsubstituted silyl group having 3 to 30 carbon atoms, for example, trimethylsilyl, tert-butyldimethylsilyl, and phenyldimethylsilyl). These groups may further have a substituent in a case where they are groups which can be further substituted. Examples of the additional substituents include the groups described in the above-mentioned substituent group T.

<<Other Coloring Agents>>>

For the coloring composition of the present invention, coloring agents (other coloring agents) other than the above-mentioned compounds (1) to (4) can further be used. It is preferable that the coloring composition of the present invention includes other coloring agents. Such other coloring agents may be either dyes or pigments, both of which may be used in combination. The pigments are preferable. Examples of the pigments include various inorganic pigments or organic pigments known in the related art. Further, whether the pigments are inorganic or organic, taking the view that high transmittance is preferable into consideration, the pigments which are as fine as possible are preferably used, and taking handleability into consideration, the average primary particle diameter of the pigments is preferably 0.01 to 0.1 m, and more preferably 0.01 to 0.05 μm.

Examples of the inorganic pigments include metal compounds such as a metal oxide and a metal complex salt, and specific examples thereof include metal oxides of black pigments such as carbon black and titanium black, oxides of metals such as iron, cobalt, aluminum, cadmium, lead, copper, titanium, magnesium, chromium, zinc, and antimony, and complex oxides of the metals.

Examples of the organic pigments include the following ones.

Color Index (C. I.) Pigment Yellow 11, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like C. I. Pigment Orange 2, 5, 13, 16, 17:1, 31, 34, 36, 38, 43, 46, 48, 49, 51, 52, 55, 59, 60, 61, 62, 64, 71, 73, and the like C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Green 7, 10, 36, 37, 58, and 59

C. I. Pigment Violet 1, 19, 23, 27, 32, 37, and 42

C. I. Pigment Blue 1, 2, 15, 15:1, 15:2, 15:3, 15:4, 15:6, 16, 22, 60, 64, 66, 79, and 80

As the dye, for example, the dyes disclosed in JP1989-90403A (JP-S64-90403A), JP1989-91102A (JP-S64-91102A), JP1989-94301A (JPH01-94301A), JP1994-11614A (JP-H06-11614A), JP2592207B, U.S. Pat. Nos. 4,808,501A, 5,667,920A, 505,950A, 5,667,920A, JP1993-333207A (JP-H05-333207A), JP1994-35183A (JP-H06-35183A), JP1994-51115A (JP-H06-51115A), and JP1994-194828A (JP-H06-194828A) can be used. With respect to the chemical structure, a pyrazoleazo compound, a pyrromethene compound, an anilinoazo compound, a triphenylmethane compound, an anthraquinone compound, a benzylidene compound, an oxonol compound, a pyrazoletriazole azo compound, a pyridoneazo compound, a cyanine compound, a phenothiazine compound, a pyrrolopyrazoleazomethine compound, or the like can be used. In addition, as the dye, a dye multimer may also be used. Examples of the dye multimer include the compounds described in JP2011-213925A, JP2013-041097A, JP2015-028144A, and JP2015-030742A.

As other coloring agents, a green coloring agent is preferable, a green pigment is more preferable, a halogenated phthalocyanine pigment is still more preferable, and a halogenated zinc phthalocyanine pigment is particularly preferable. The halogenated zinc phthalocyanine pigment is a halogenated zinc phthalocyanine pigment having zinc as a central metal, and takes a planar structure in which the zinc as the central metal is positioned within a region surrounded by four nitrogen atoms of an isoindole ring as shown in Formula (A1).

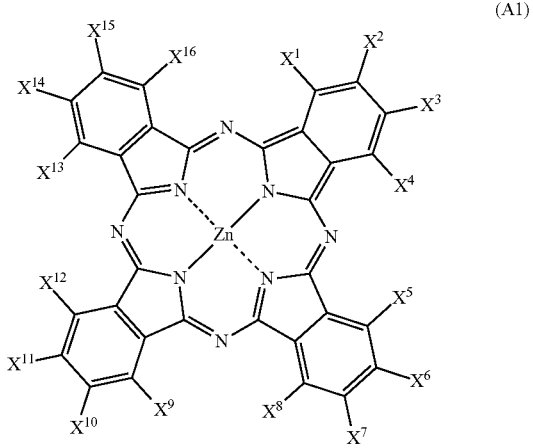

(A1)

It is preferable that in Formula (A1), any 8 to 16 positions of $X^1$ to $X^{16}$ each represent a halogen atom, and the remaining positions each represent a hydrogen atom or a substituent. Examples of the substituent include the groups described in the above-mentioned substituent group T.

As for specific examples of the halogenated zinc phthalocyanine pigment, for example, the aspects shown in <1> to <3> below may be mentioned as preferred examples.

<1> A halogenated zinc phthalocyanine pigment in which the average number of halogen atoms per molecule of the phthalocyanine is 8 to 12. In this aspect, it is preferable that $X^1$ to $X^{16}$ include one or more chlorine atoms, bromine atoms, or hydrogen atoms. In addition, it is preferable that $X^1$ to $X^{16}$ have 0 to 4 chlorine atoms, 8 to 12 bromine atoms, and 0 to 4 hydrogen atoms. With regard to the specific examples, reference can be made to the description in paragraph Nos. 0013 to 0039, and 0084 to 0085 of JP2007-284592A, the contents of which are incorporated herein by reference.

<2> A halogenated zinc phthalocyanine pigment in which the average number of halogen atoms per molecule of the phthalocyanine is 14 to 16. In this aspect, the average number of halogen atoms per molecule of the phthalocyanine is more preferably 15 or 16. Further, the average number of bromine atoms per molecule of the phthalocyanine is preferably 0 to 12, more preferably 1 to 8, still more preferably 1 to 7, and even still more preferably 2 to 7.

<3> A halogenated zinc phthalocyanine pigment in which the average number of halogen atoms per molecule of the phthalocyanine is 10 to 14, and the average number of bromine atoms per molecule of the phthalocyanine is 8 to 12, and the average number of chlorine atoms per molecule of the phthalocyanine is 2 to 5. Specific examples thereof include the compounds described in WO2015/118720A.

Examples of the halogenated zinc phthalocyanine pigment include C. I. Pigment Green 58 and 59 as a compound classified into a pigment in Color Index (C. I.; published by The Society of Dyers and Colourists).

In a case where the coloring composition of the present invention contains other coloring agents, the content of such other coloring agents is preferably 100 to 300 parts by mass with respect to 100 parts by mass of the total amount of the compounds (1) to (4). The upper limit is preferably 250 parts by mass or less, and more preferably 230 parts by mass or less. The lower limit is preferably 150 parts by mass or more, and more preferably 200 parts by mass or more. The other coloring agent may be of one kind or of two or more kinds. In a case where two or more kinds of the coloring agents are included, the total amount thereof preferably falls within the range.

<<Phthalimide Compound>>

The coloring composition of the present invention includes a phthalimide compound.

The phthalimide compound causes an interaction with the compounds (1) to (4), and thus, makes it possible to produce a film having fewer defects generated even in a case where the coloring composition is stored for a long period of time in an environment with variations in temperature. The phthalimide compound for use in the present invention is preferably a compound represented by General Formula (PI).

In particular, by using the compound represented by Formula (1) in combination with the phthalimide compound, it is possible to suppress generation of foreign matters even in a case where a coating film is produced and then stored in a coating film state (delayed and left to stand).

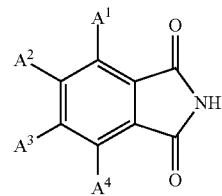

(PI)

In Formula (PI), $A^1$ to $A^4$ each independently represent a hydrogen atom, a halogen atom, or an alkyl group.

Examples of the halogen atom include a chlorine atom, a bromine atom, and a fluorine atom, with the chlorine atom or the fluorine atom being preferable.

The number of carbon atoms in the alkyl group is preferably 1 to 10, and more preferably 1 to 5. The alkyl group may be linear, branched, or cyclic, and is preferably linear or branched, and more preferably linear.

It is preferable that at least one of $A^1$, ..., or $A^4$ is selected from a chlorine atom and a bromine atom, and more preferably a bromine atom. Further, it is more preferable that all of $A^1$ to $A^4$ are selected from a chlorine atom and a bromine atom, and it is still more preferable that all of $A^1$ to $A^4$ are bromine atoms.

In the coloring composition of the present invention, the content of the phthalimide compound is preferably 0.001 to 6.0 parts by mass with respect to 100 parts by mass of the total amount of the compounds represented by Formulae (1) to (4). The lower limit is preferably 0.1 parts by mass or more, and more preferably 1.0 part by mass or more. The upper limit is preferably 5.0 parts by mass or less, and more preferably 3.0 parts by mass or less.

Furthermore, in the coloring composition of the present invention, the content of the phthalimide compound is preferably 0.001% to 5% by mass with respect to the total solid content in the coloring composition. The lower limit is preferably 0.01% by mass or more, more preferably 0.1% by mass or more, and still more preferably 0.15% by mass or more. The upper limit is preferably 3% by mass or less, more preferably 1% by mass or less, still more preferably 0.9% by mass or less, and particularly preferably 0.8% by mass or less.

In a case where the content of the phthalimide compound is within the range, the effect of the present invention is likely to be more remarkably obtained.

The phthalimide compound may be of one kind or of two or more kinds. In a case where two or more kinds of the phthalimide compounds are included, the total amount thereof preferably falls within the range.

<<Resin>>

The coloring composition of the present invention includes a resin. The resin is blended in, for example, an application for dispersing a coloring agent in the composition or an application as a binder. Incidentally, a resin which is usually used for dispersing a coloring agent such as a pigment is also referred to as a dispersant. However, such uses of the resin are only exemplary, and the resin can also be used for other purposes, in addition to such uses.

The content of the resin in the coloring composition of the present invention is preferably 10% to 80% by mass with respect to the total solid content of the coloring composition. The lower limit is preferably 15% by mass or more, and more preferably 20% by mass or more. The upper limit is preferably 70% by mass or less, and more preferably 60% by mass or less.

<<<Dispersant>>>

The coloring composition of the present invention preferably includes a dispersant as the resin. In particular, in a case where a pigment is used as the coloring agent, it is preferable that the dispersant is included. Examples of the dispersant include an acidic dispersant (acidic resin) and a basic dispersant (basic resin).

It is preferable that the dispersant includes at least an acidic dispersant, and it is more preferable that the dispersant includes an acidic dispersant alone. By making the dispersant include at least the acidic dispersant, the dispersibility of the coloring agent is improved and the brightness unevenness is hardly generated. Further, since excellent developability is obtained, pattern formation can be more suitably formed by photolithography. In addition, an expression, "the dispersant includes an acidic dispersant alone" means, for example, that the content of the acidic dispersant in the total mass of the dispersant is preferably 99% by mass or more, and can be more preferably 99.9% by mass or more.

Here, the acidic dispersant (acidic resin) is a resin in which the amount of acid groups is more than that of basic groups. As the acidic dispersant (acidic resin), a resin in which the amount of the acid groups is 70% by mole or more with respect to 100% mole of the total amount of the acid groups and the basic groups is preferable, and a resin which is only substantially composed of acid groups is more preferable. The acid group contained in the acidic dispersant (acidic resin) is preferably a carboxyl group.

Furthermore, the basic dispersant (basic resin) is a resin in which the amount of acid groups is more than that of basic groups. As the basic dispersant (basic resin), a resin in which the amount of the basic groups is 50% by mole or more with respect to 100% mole of the total amount of the acid groups and the basic groups is preferable. The basic group contained in the basic dispersant is preferably an amine.

The acid value of the acidic dispersant (acidic resin) is preferably 40 to 105 mgKOH/g, more preferably 50 to 105 mgKOH/g, and still more preferably 60 to 105 mgKOH/g.

Examples of the dispersant include polymer dispersants [for example, a polyamidoamine and a salt thereof, a polycarboxylic acid and a salt thereof, an unsaturated high-molecular-weight acid ester, a modified polyurethane, a modified polyester, a modified poly(meth)acrylate, a (meth)acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft-type polymer, and a block-type polymer, depending on its structure. The polymer dispersant is adsorbed on a surface of a pigment and acts so as to prevent re-aggregation. For this reason, examples of a preferable structure thereof include a terminal-modified polymer, a graft-type polymer, and a block-type polymer, which have an anchoring site on the surface of a pigment.

As the resin (dispersant), a graft copolymer including a repeating unit represented by any one of Formulae (1) to (4) can also be used.

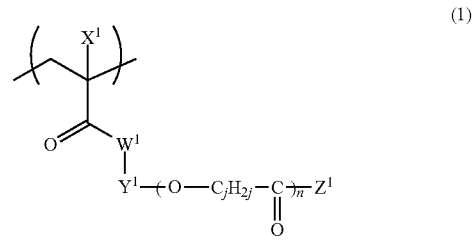

(1)

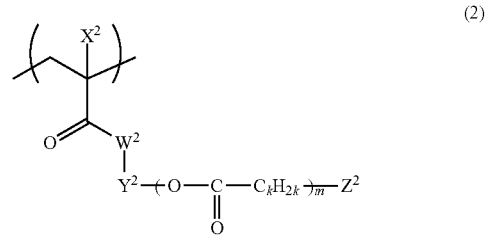

(2)

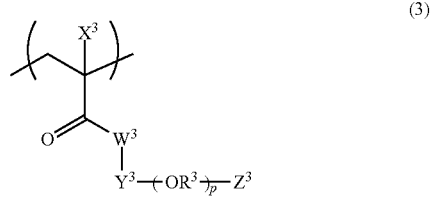

(3)

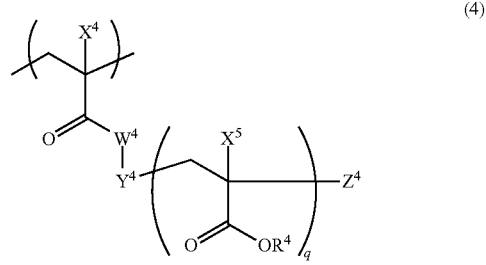

(4)

In Formulae (1) to (4), $W^1$, $W^2$, $W^3$, and $W^4$ each independently represent an oxygen atom or NH, $X^1$, $X^2$, $X^3$, $X^4$, and $X^8$ each independently represent a hydrogen atom or a monovalent organic group, $Y^1$, $Y^2$, $Y^3$, and $Y^4$ each independently represent a divalent linking group, $Z^1$, $Z^2$, $Z^3$, and $Z^4$ each independently represent a monovalent organic group, R represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atoms $X^1$, $X^2$, $X^3$, $X^4$, and $X^5$ are each preferably a hydrogen atom or an alkyl group having 1 to 12 carbon atoms, and are each independently more preferably a hydrogen atom or methyl group, and particularly preferably methyl groups. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that $Z^1$, $Z^2$, $Z^3$, and $Z^4$ each independently represent an alkyl group or an alkoxy group having 5 to 24 carbon atoms, and among these, a branched alkyl group having 5 to 24 carbon atoms, a cyclic alkyl group having 5 to 24 carbon atoms, or an alkoxy group having 5 to 24 carbon atoms is preferable. In addition, the alkyl group contained in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is still more preferable. In Formula (4), in a case where q is 2 to 500, $X^8$'s and $R^4$'s which are present in plural numbers in a graft copolymer may be the same as or different from each other.

With regard to the graft copolymer, reference can be made to the description in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

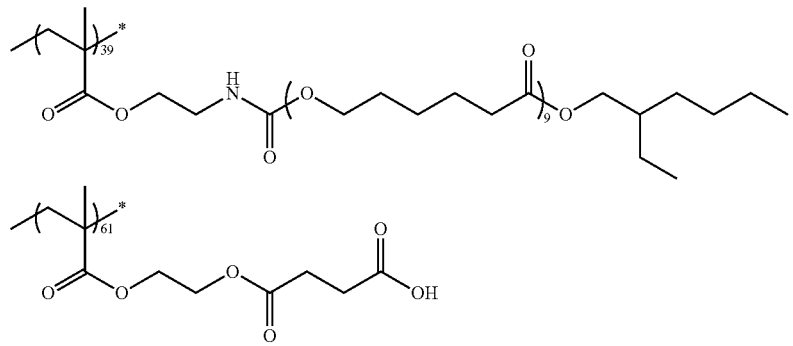

Furthermore, as the resin (dispersant), an oligoimine-based dispersant having a nitrogen atom in least one of the main chain or a side chain can be used. As the oligoimine-based dispersant, a resin having a side chain including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. As specific examples of the oligoimine-based dispersant, the resins described in paragraph Nos. 0168 to 0174 of JP2012-255128A can be used.

The dispersant is also available as a commercially available product, and specific examples thereof include "DA-7301" manufactured by Kusumoto Chemicals, Ltd., "Disperbyk-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers), and BYK-P104 and P105 (unsaturated high-molecularweight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (aliphatic polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalene sulfonate formaldehyde condensate), MS, C, and SN-B (aromatic sulfonate formaldehyde condensate), HOMOGENOL L-18 (polymeric polycarboxylic acid), EMULGEN 920, 930, 935, and 985 (polyoxyethylene nonyl phenyl ether), and ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft-type polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP-341" manufactured by Shin-Etsu Chemical Co., Ltd., "W001: Cationic Surfactant" manufactured by Yusho Co., Ltd., non-ionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "W004, W005, and W017", "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name) S-20" manufactured by Sanyo Chemical Industries, Ltd. In addition, Acryl-Based FFS-6752 and Acryl-Based FFS-187 (both manufactured by Fujikura Kasei Co., Ltd.), ACRYCURE RD-F8 (manufactured by Nippon Shokubai Co., Ltd.), or CYCLOMER P (manufactured by DAICEL-ALLNEX LTD.) can also be used.

Furthermore, the resins described as the dispersant can also be used in applications other than those as dispersants. For example, the resins can also be used as a binder.

<<<Alkali-Soluble Resin>>>

The coloring composition of the present invention preferably contains an alkali-soluble resin as the resin. By incorporation of the alkali-soluble resin, the developability and the pattern formability are improved. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high-molecular-weight polymer, and can be appropriately selected from alkali-soluble resins having at least one group enhancing alkali solubility in a molecule (preferably a molecule having an acryl-based copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali solubility (hereinafter also referred to as an acid group) include a carboxyl group, a phosphoric acid group, a sulfonic acid group, and a phenolic hydroxyl group. The group enhancing alkali solubility is preferably a group which is soluble in an organic solvent and can be developed by an aqueous weak alkaline solution, and particularly preferred examples thereof include (meth)acrylic acid. These acid groups may be used singly or in combination of two or more kinds thereof.

For the production of the alkali-soluble resin, for example, a method using known radical polymerization can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxyl group in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Further, the N-position-substituted maleimide monomers described in JP1998-300922A (JP-H10-300922A) can also be used as such other monomers. Examples of the N-position-substituted maleimide monomers include N-phenylmaleimide and N-cyclohexylmaleimide. Other monomers copolymerizable with a (meth)acrylic acid may be used singly or in combination of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used. In addition, as a commercially available product thereof, for example, FF-426 (manufactured by Fujikura Kasei Co., Ltd.) or the like can also be used.

Moreover, as the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), and ACRY-CURE RD-F8 (manufactured by Nippon Shokubai Co., Ltd.).

It is also preferable that the alkali-soluble resin includes a polymer obtained by polymerizing monomer components including a compound represented by General Formula (ED1) and/or the compound represented by General Formula (1) of JP2010-168539A (these compounds are hereinafter also referred to as an "ether dimer" in some cases).

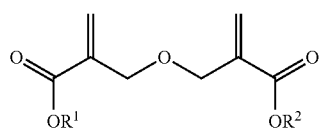

(ED1)

In General Formula (ED1), $R^1$ and $R^2$ each independently represent a hydrogen atom or a hydrocarbon group having 1 to 25 carbon atoms, which may have a substituent.

Specific examples of the ether dimer include those described in paragraph 0317 of JP2013-29760A, the contents of which are incorporated herein by reference. These ether dimers may be of one kind or of two or more kinds.

The alkali-soluble resin may include a repeating unit derived from a compound represented by Formula (X).

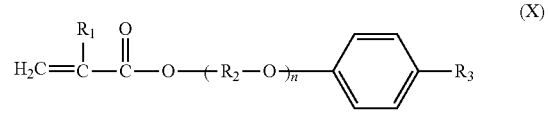

(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

Specific examples of the alkali-soluble resin include the following resins. In the following formulae, Me is a methyl group.

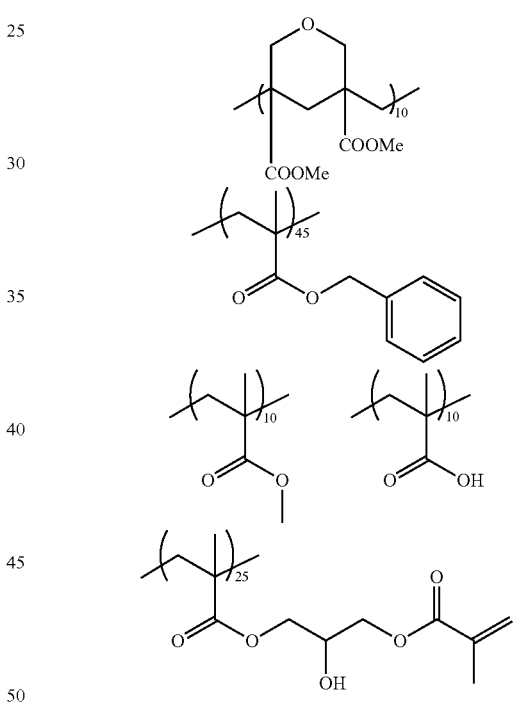

With regard to the alkali-soluble resin, reference can be made to the descriptions in paragraphs 0558 to 0571 of JP2012-208494A ([0685] to [0700] of the corresponding US2012/0235099A), the contents of which are incorporated herein by reference. In addition, the copolymers (B) described in paragraph Nos. 0029 to 0063 of JP2012-32767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins in Examples of the document, the binder resins described in paragraph Nos. 0132 to 0143 of JP2013-024934A and the binder resins used in Examples of the document, the binder resins described in paragraph Nos. 0092 to 0098 of JP2011-242752A and used in Examples, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and even still more preferably 120 mgKOH/g or less.

The content of the alkali-soluble resin is preferably 1% to 80% by mass with respect to the total solid content of the coloring composition. The lower limit is preferably 2% by mass or more, and more preferably 3% by mass or more. The upper limit is preferably 70% by mass or less, and more preferably 60% by mass or less. The coloring composition of the present invention may include one kind or two or more kinds of the alkali-soluble resins. In a case where two or more kinds of the alkali-soluble resin are included, a total amount thereof preferably falls within the range.

<<Solvent>>

The coloring composition of the present invention preferably contains a solvent. The solvent is preferably an organic solvent. The solvent is not particularly limited as long as it satisfies the solubility of the respective components or the coatability of the coloring composition.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate, ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monoethyl ether acetate (1-methoxy-2-propylacetate), propylene glycol monoethyl ether acetate, propylene glycol monopropyl ether acetate, and 2-methoxy-1-propylacetate, ketones, for example, methyl ethyl ketone, cyclohexanone, cyclopentanone, 2-heptanone, and 3-heptanone, and aromatic hydrocarbons, for example, toluene and xylene.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate (1-methoxy-2-propylacetate), and 2-methoxy-1-propylacetate.

In the present invention, the organic solvent preferably includes 2-methoxy-1-propylacetate. The content of 2-methoxy-1-propylacetate is preferably 0.001% to 5% by mass with respect to the mass of the coloring composition. The upper limit is preferably 3% by mass or less, and more preferably 2% by mass or less.

Furthermore, the content of 2-methoxy-1-propylacetate is preferably 0.01% to 0.5% by mass with respect to the mass of the solvent. The lower limit is preferably 0.05% by mass or more, and more preferably 0.1% by mass or more. The upper limit is preferably 0.4% by mass or less, and more preferably 0.2% by mass or less.

In the present invention, the organic solvent preferably has a content of peroxides of 0.8 mmol/L or less, and more preferably, it does not substantially include peroxides.

The content of the solvent is preferably an amount such that the total solid content of the coloring composition is 5% to 80% by mass. The lower limit is preferably 10% by mass or more. The upper limit is preferably 60% by mass or less, more preferably 50% by mass or less, and still more preferably 40% by mass or less.

<<Curable Compound>>

The coloring composition of the present invention preferably contains a curable compound. As the curable compound, known compounds which can be crosslinked by a radical, an acid, or heat can be used. Examples thereof include compounds having a group having an ethylenically unsaturated bond, a cyclic ether (epoxy or oxetane) group, a methylol group, or the like. Examples of the group having an ethylenically unsaturated bond include a vinyl group, a (meth)allyl group, and a (meth)acryloyl group. In the present invention, the curable compound is preferably a polymerizable compound, and more preferably a radically polymerizable compound.

The content of the curable compound is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof preferably falls within the range.

(Polymerizable Compound) In the present invention, the polymerizable compound may be, for example, any of chemical forms such as a monomer, a prepolymer, that is, a dimer or a trimer, an oligomer, a mixture thereof, a multimer thereof, and the like. In a case where the polymerizable compound is a photoradically polymerizable compound, the monomer is preferable.

The molecular weight of the polymerizable compound is preferably 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, and more preferably a trifunctional to hexafunctional (meth)acrylate compound. With regard to these specific examples, reference can be made to the compounds described in paragraph Nos. 0095 to 0108 of JP2009-288705A, paragraph No. 0227 of JP2013-29760A, and paragraph Nos. 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), and a compound having a structure in which these (meth)acryloyl groups are bonded via an ethylene glycol or propylene glycol residue (for example, SR454 and mgKOH/g or less, it is advantageous in production or handling. In addition, the photopolymerization performance is good and the curability is excellent.

In another preferred aspect, the polymerizable compound is a compound having a caprolactone structure. The polymerizable compound having a caprolactone structure is commercially available as KAYARAD DPCA series from Nippon Kayaku Co., Ltd., and examples thereof include DPCA-20, DPCA-30, DPCA-60, and DPCA-120.

As the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups.

Specific examples of the polymerizable compound having an alkyleneoxy group include the following compound.

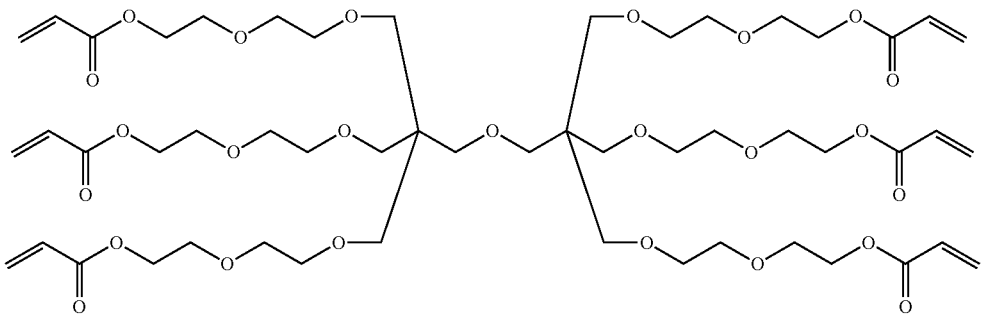

SR499, commercially available from Sartomer Company, Inc.) are preferable. Oligomer types of these can also be used. In addition, KAYARAD RP-1040 and DPCA-20 (manufactured by Nippon Kayaku Co., Ltd.) can also be used. In addition, the following compound can also be used.

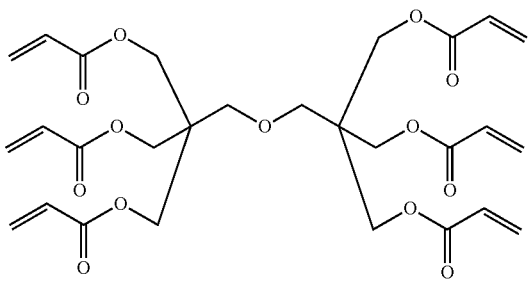 [SMILES: C=CC(=O)OCC(COCC(COC(=O)C=C)(COC(=O)C=C)COC(=O)C=C)(COC(=O)C=C)COC(=O)C=C]

The polymerizable compound may have an acid group such as a carboxyl group, a sulfonic acid group, and a phosphoric acid group. Examples of the commercially available product thereof include M-305, M-510, and M-520 which are each polybasic acid-modified acryl oligomers manufactured by Toagosei Co., Ltd.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas in a case where the acid value is 40

Examples of the commercially available product of the polymerizable compound having an alkyleneoxy group include SR-494 which is a tetrafunctional acrylate having four ethyleneoxy groups, manufactured by Sartomer Co., Inc., DPCA-60 which is a hexafunctional acrylate having six pentyleneoxy groups, and TPA-330 which is a trifunctional acrylate having three isobutyleneoxy groups, both manufactured by Nippon Kayaku Co., Ltd.

As the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-16765B), and the urethane compounds which have an ethylene oxide skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use the addition-polymerizable compounds having an amino structure or a sulfide structure in the molecule, described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

In a case where a polymerizable compound is used as the curable compound, the content of the polymerizable compound is preferably 0.1% to 50% by mass with respect to the total solid content of the composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof preferably falls within the range.

In addition, the content of the polymerizable compound is preferably 10% to 100% by mass, and more preferably 30% to 100% by mass, with respect to the total mass of the curable compound.

(Compound Having Epoxy Group)

In the present invention, a compound having an epoxy group can be used as the curable compound. The compound having an epoxy group is preferably a compound having two or more epoxy groups per molecule. The number of epoxy groups per molecule is preferably 2 to 100. The upper limit can be set to, for example, 10 or less, or to 5 or less.

The compound having an epoxy group in the present invention preferably has a structure having an aromatic ring and/or an aliphatic ring, and more preferably has a structure having an aliphatic ring. The epoxy group is preferably bonded to an aromatic ring and/or an aliphatic ring via a single bond or a linking group. Examples of the linking group include groups including at least one selected from an alkylene group, an arylene group, —O—, a structure represented by —NR$^1$— (R$^1$ represents a hydrogen atom, an alkyl group which may have a substituent, or an aryl group which may have a substituent, with the hydrogen atom being preferable), —SO$_2$—, —CO—, —O—, and —S—.

In a case of a compound having an aliphatic ring, a compound in which an epoxy group is bonded to an aliphatic ring via a direct bond (a single bond) is preferable. In a case of a compound having an aromatic ring, a compound in which an epoxy group is bonded to an aromatic ring via a linking group is preferable. The linking group is preferably an alkylene group, or a group formed by combination of an alkylene group with —O—.

In addition, as the compound having an epoxy group, a compound having a structure in which 2 or more aromatic rings are linked to a hydrocarbon group can also be used. The hydrocarbon group is preferably an alkylene group having 1 to 6 carbon atoms. The epoxy group is preferably linked via the linking group.

The epoxy equivalent (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low-molecular-weight compound (for example, a molecular weight of less than 2,000, and further a molecular weight of less than 1,000) or a high-molecular-weight compound (macromolecule) (for example, a molecular weight of 1,000 or more, and in a case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 3,000 or less, more preferably 2,000 or less, and still more preferably 1,500 or less.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-211L, EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

In a case where the compound having an epoxy group is used as the curable compound, the content of the compound having an epoxy group is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The compound having an epoxy group may be used singly or in combination of two or more kinds thereof. In a case where the polymerizable compound is used in combination of two or more kinds thereof, the total amount thereof preferably falls within the range.

Furthermore, the content of the compound having an epoxy group is preferably 1% to 80% by mass, and more preferably 1% to 50% by mass, with respect to the total mass of the curable compound.

In addition, in a case where the polymerizable compound is used in combination with the compound having an epoxy group, the mass ratio of the polymerizable compound to the compound having an epoxy group is preferably polymerizable compound:compound having an epoxy group=100:1 to 100:400, and more preferably 100:1 to 100:100.

<<Curing Accelerator>>

A curing accelerator may be added to the coloring composition of the present invention for the purpose of promoting the reaction of a polymerizable compound or lowering a curing temperature. Examples of the curing accelerator include polyfunctional thiol compounds having two or more mercapto groups in a molecule thereof. The polyfunctional thiol compounds may also be added for the purpose of improving stability, odor, resolution, developability, adhesiveness, or the like. The polyfunctional thiol compounds are preferably secondary alkanethiols, and particularly preferably compounds having structures represented by General Formula (T1).

General Formula (T1)

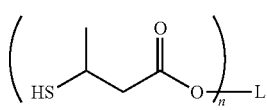

(In Formula (T1), n represents an integer of 2 to 4, and L represents a divalent to tetravalent linking group.)

In General Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (12) to (T4), with the compound represented by Formula (T2) being particularly preferable. These polyfunctional thiol compounds can be used singly or in combination of two or more kinds thereof.

(T2)

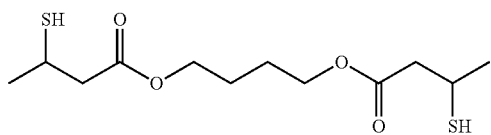

(T3)

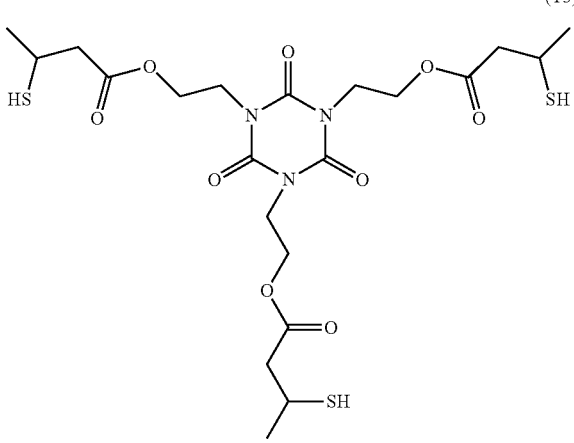

(T4)

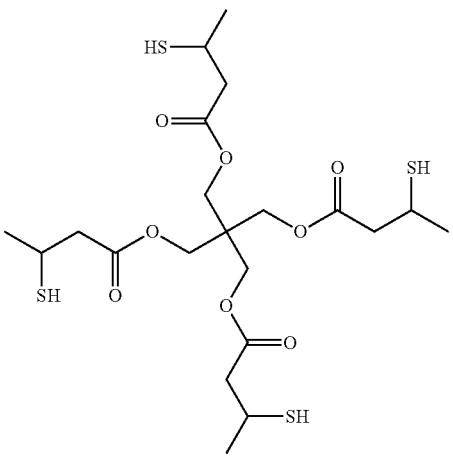

Moreover, as the curing accelerator, a methylol-based compound (for example, the compounds exemplified as a crosslinking agent in paragraph 0246 of JP2015-34963A), amines, phosphonium salts, amidine salts, amide compounds (each of which are the curing agents described in, for example, paragraph 0186 of JP2013-41165A), base generators (for example, the ionic compounds described in JP2014-55114A), cyanate compounds (for example, the compounds described in paragraph 0071 of JP2012-150180A), alkoxysilane compounds (for example, the alkoxysilane compounds having epoxy groups, described in JP2011-253054A), onium salt compounds (for example, the compounds exemplified as an acid generator in paragraph 0216 of JP2015-34963A, and the compounds described in JP2009-180949A), or the like can also be used.

In a case where the coloring composition of the present invention contains the curing accelerator, the content of the curing accelerator is preferably 0.3% to 8.9% by mass, and more preferably 0.8% to 6.4% by mass, with respect to the total solid content of the coloring composition.

<<Photopolymerization Initiator>>

It is preferable that the coloring composition of the present invention further contains a photopolymerization initiator. The photopolymerization initiator is not particularly limited as long as it can initiate the polymerization of polymerizable compounds, and can be appropriately selected from known photopolymerization initiators. For example, it is preferably sensitive to radiations from UV to visible regions. Further, it may be an activator that causes a certain action with a photoexcited sensitizer to generate active radicals or an initiator that functions to initiate cationic polymerization depending on the type of the monomer. Incidentally, the photopolymerization initiator preferably contains at least one compound having a molar light absorption coefficient of at least about 50 in the range of about 300 nm to 800 nm (more preferably 330 nm to 500 nm).

Examples of the photopolymerization initiator include halogenated hydrocarbon derivatives (for example, those having a triazine skeleton and those having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Moreover, from the viewpoint of the exposure sensitivity, as the photopolymerization initiator, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A), and the acylphosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379EG (trade names: all manufactured by BASF) which are commercially available products can be used. In addition, as the aminoacetophenone-based initiator, the compound described in JP2009-191179A, of which an absorption wavelength matches with a light source at a long wavelength of 365 nm, 405 nm, or the like can be used. In addition, as the acylphosphine-based initiator, IRGACURE-819 or DAROCUR-TPO (trade names, both manufactured by BASF) which is a commercially available product can be used.

In particular, in a case where the coloring composition of the present invention is used to manufacture a color filter for a solid-state imaging device, it is important that it should be not only readily curable but also developable without leaving residues in unexposed areas since it is necessary to form micropatterns in sharp shapes. From such a viewpoint, it is particularly preferable to use an oxime compound as a photopolymerization initiator. In particular, when micropatterns are formed in a solid-state imaging device, a stepper exposure device (exposure machine) is used for curing exposure, but such a exposure machine may be damaged by halogen, and thus, it is necessary to reduce the addition amount of the photopolymerization initiator. Thus, taking these points into consideration, it is particularly preferable to use the oxime compound as the photopolymerization initiator for forming micropatterns as in a solid-state imaging device or the like. In addition, by using the oxime compound, color transfer properties can be further improved.

With respect to specific examples of the photopolymerization initiator, reference can be made to, for example, paragraphs 0265 to 0268 of JP2013-29760A, the contents of which are incorporated herein by reference.

More preferred examples of the photopolymerization initiator include an oxime compound. As the specific examples of the oxime initiator, the compound described in JP2001-233842A, the compound described in JP2000-80068A, and the compound described in JP2006-342166A can be used.

Examples of the oxime compound such as an oxide derivative, which can be suitably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound also include the compounds described in J. C. S. Perkin II (1979), pp. 1653 to 1660, J. C. S. Perkin II (1979), pp. 156 to 162, Journal of Photopolymer Science and Technology (1995), pp. 202 to 232, and each of the publications of JP2000-66385A, JP2000-80068A, JP2004-534797A, and JP2006-342166A.

As the commercially available products thereof, IRGACURE-OXE01 (manufactured by BASF) and IRGACURE-OXE02 (manufactured by BASF) are also suitably used. In addition, TRONLY TR-PBG-304, TRONLY TR-PBG-309, and TRONLY TR-PBG-305 (manufactured by CHANGZIIOU TRONLY NEW ELECTRONIC MATERIALS CO., LTD.), or ADEKA ARKLS NCI-930 (manufactured by ADEKA Corporation) can also be used.

Furthermore, as oxime compounds other than the above-described oxime compounds, the compound described in JP2009-519904A in which oxime is linked to an N-position of carbazole ring, the compound described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used. Preferably, reference can be made to the descriptions in, for example, paragraphs 0274 and 0275 of JP2013-29760A, the contents of which are incorporated herein by reference. Specifically, as the oxime compound, a compound represented by General Formula (OX-1) is preferable. In addition, the compound may be an oxime compound in which an N—O bond of oxime forms an (E) isomer, an oxime compound in which the N—O bond forms a (Z) isomer, or a mixture in which the N—O bond forms a mixture of the (E) isomer and the (Z) isomer.

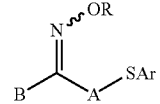

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, a cycloalkylene group, or an alkynylene group is preferable. These groups may have one or more substituents. Examples of the substituent include the above-mentioned substituents.

In the present invention, an oxime compound having a fluorene ring can be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

In the present invention, an oxime compound having a nitro group can be preferably used as the photopolymerization initiator. Specific examples of the oxime compound having a nitro group include the compounds described in paragraphs 0031 to 0047 of JP2013-114249A, paragraphs 0008 to 0012 and 0070 to 0079 of JP2014-137466A, and ADEKA ARKLS NCI-831 (manufactured by ADEKA).

Specific examples of the oxime compound which is preferably used in the present invention are shown below, but the present invention is not limited thereto.

(C-1)
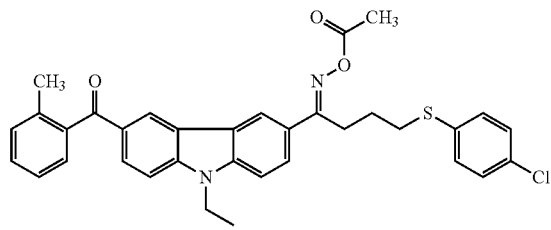

(C-2)
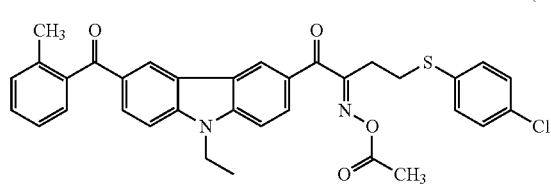

(C-3)
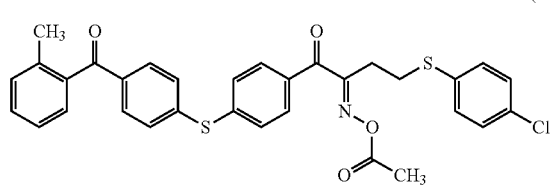

(C-4)
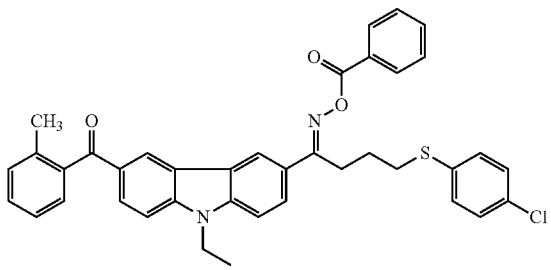

(C-5)
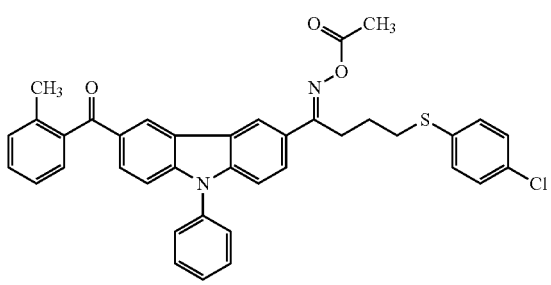

(C-6)
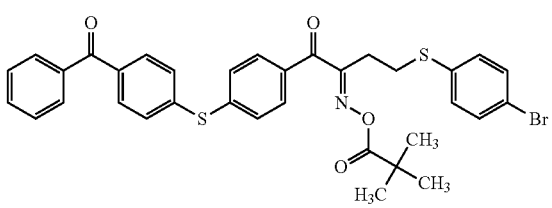

(C-7)
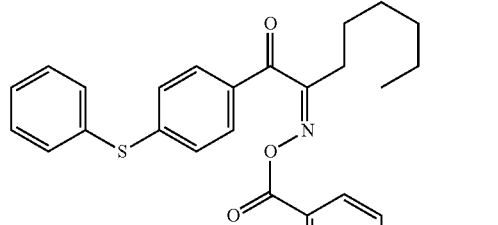

(C-8)
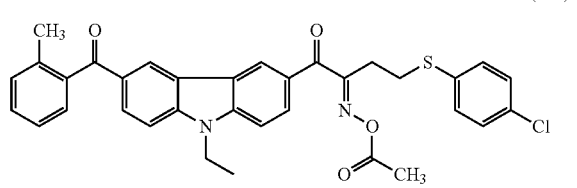

As the oxime compound, the compound having a maximum absorption wavelength in a wavelength range of 350 nm to 500 nm is preferable, the compound having an absorption wavelength in a wavelength range of 360 nm to 480 nm is more preferable, and the compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The photopolymerization initiator may be used in combination of two or more kinds thereof, as desired.

In a case where the coloring composition of the present invention contains a photopolymerization initiator, the content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained. The coloring composition of the present invention may include one kind or two or more kinds of the photopolymerization initiators. In a case where two or more kinds of the photopolymerization initiators are included, the total amount thereof preferably falls within the range.

<<Pigment Derivative>>

The coloring composition of the present invention preferably contains a pigment derivative. The pigment derivative is preferably a compound having a structure in which a portion of an organic pigment is substituted with an acidic group, a basic group, or a phthalimidomethyl group. As the pigment derivative, a pigment derivative having an acidic group or a basic group is preferable from the viewpoint of dispersibility and the dispersion stability of the colorant A, and a pigment derivative having a basic group is particularly preferable. Further, a combination of the above-mentioned resin (dispersant) and the pigment derivative is preferably a combination in which the resin is an acidic resin and the pigment derivative has a basic group.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment. In addition, the acidic group contained in the pigment derivative is preferably a sulfonic acid group, a carboxylic acid group, or a quaternary ammonium base group thereof, more preferably a carboxylic acid group or a sulfonic acid group, and particularly preferably a sulfonic acid group. The basic group contained in the pigment derivative is preferably an amino group, and particularly preferably a tertiary amino group. With regard to the specific examples of the pigment derivative, reference can be made to the descriptions in paragraphs 0162 to 0183 of JP2011-252065A, the contents of which are incorporated herein by reference.

In a case where the coloring composition of the present invention contains the pigment derivative, the content of the pigment derivative is preferably 1% to 30% by mass, and more preferably 3% to 20% by mass, with respect to the mass of the pigment. The pigment derivative may be used singly or in combination of two or more kinds thereof.

<<Surfactant>>

From the viewpoint of further improving coatability, the coloring composition of the present invention may contain various surfactants. As the surfactant, various surfactants such as a fluorine-based surfactant, a non-ionic surfactant, a cationic surfactant, an anionic surfactant, and a silicon-based surfactant can be used.

By incorporating a fluorine-based surfactant into the coloring composition of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using to which a coloring composition containing a fluorine-based surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the solubility of the surfactant in the composition is also good.

Examples of the fluorine-based surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F475, MEGAFAC F479, MEGAFAC F482, MEGAFAC F554, MEGAFAC F780, and RS-72-K (all manufactured by DIC Corporation), FLUORAD FC430, FC431, and FC171 (all manufactured by Sumitomo 3M), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PF636, PF656, PF6320, PF6520, and PF7002 (manufactured by OMNOVA). Further, as the fluorine-based surfactant, the compounds described in paragraph 0015 to 0158 of JP2015-117327A can be used. As the fluorine-based surfactant, a block polymer can also be used, and specific examples thereof include the compounds described in JP2011-89090A.

The fluorine-based surfactant can also preferably use a fluorine-containing, high-molecular-weight compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

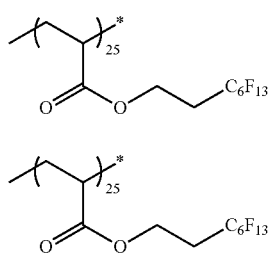 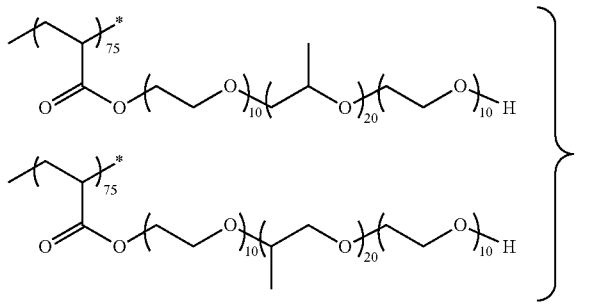

The weight-average molecular weight of the compounds is preferably 3,000 to 50,000, and is, for example 14,000.

A fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFAC RS-101, RS-102, and RS-718K, all manufactured by DIC Corporation.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.). Further, NCW-101, NCW-1001, or NCW-1002 manufactured by Wako Pure Chemical Industries, Ltd., or PIONIN D-6112-W or D-6315 manufactured by Takemoto Oil & Fat Co., Ltd. can also be used.

Specific examples of the cationic surfactant include a phthalocyanine derivative (trade name: EFKA-745, manufactured by MORISHITA KAGAKU SANGYO Corporation), an organosiloxane polymer KP-341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP-341, KF6001, and KF6002 (all manufactured by Shin-Etsu Chemical Co., Ltd.), and BYK307, BYK323, and BYK330 (all manufactured by BYK Chemie).

The surfactants may be used singly or in combination of two or more kinds thereof. The content of the surfactant is preferably 0.001% to 2.0% by mass, and more preferably 0.005% to 1.0% by mass, with respect to the total solid content of the coloring composition.

<<Silane Coupling Agent>>

The coloring composition of the present invention can contain a silane coupling agent.

The silane coupling agent is also preferably a silane compound having at least two kinds of functional groups having different reactivities per molecule and particularly preferably the compound having as the functional group, an amino group and an alkoxy group. Examples of such an silane coupling agent include N-β-aminoethyl-γ-aminopropyl-methyldimethoxysilane (KBM-602, trade name, manufactured by Shin-Etsu Chemical Co., Ltd.), N-β-aminoethyl-γ-aminopropyltrimethoxysilane (KBM-603, trade name, manufactured by Shin-Etsu Chemical Co., Ltd.), N-β-aminoethyl-γ-aminopropyltriethoxysilane (KBE-602, trade name, manufactured by Shin-Etsu Chemical Co., Ltd.), γ-aminopropyltrimethoxysilane (KBM-903, trade name, manufactured by Shin-Etsu Chemical Co., Ltd.), γ-aminopropyltriethoxysilane (KBE-903, trade name, manufactured by Shin-Etsu Chemical Co., Ltd.), and 3-methacryloxypropyltrimethoxysilane (KBM-503, trade name, manufactured by Shin-Etsu Chemical Co., Ltd.). With regard to the details of the silane coupling agent, reference can be made to the descriptions in paragraph Nos. 0155 to 0158 of JP2013-254047A, the contents of which are incorporated herein by reference.

In a case where the coloring composition of the present invention includes a silane coupling agent, the content of the silane coupling agent is preferably 0.001% to 20% by mass, more preferably 0.01% to 10% by mass, and particularly preferably 0.1% by mass to 5% by mass, with respect to the total solid content of the coloring composition. The coloring composition of the present invention may include one kind or two or more kinds of the silane coupling agents. In a case where the coloring composition includes two or more kinds of the silane coupling agent, the total amount thereof preferably falls within the range.

<<Polymerization Inhibitor>>

It is also preferable that to the coloring composition of the present invention contains a small amount of a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine salt (an ammonium salt, a cerous salt, or the like) In a case where the coloring composition of the present invention includes a polymerization inhibitor, the content of the polymerization inhibitor is preferably 0.01% to 5% by mass with respect to the total solid content of the coloring composition. The coloring composition of the present invention may include one kind or two or more kinds of the polymerization inhibitor. In a case where the coloring composition includes two or more kinds of the polymerization inhibitor, the total amount thereof preferably falls within the range.

<<Other Additives>>

Various additives, for example, a filler, an adhesion promoter, an antioxidant, an ultraviolet absorber, and an aggregation inhibitor can be blended into the coloring composition of the present invention, as desired. Examples of these additives include those described in paragraphs 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof. The coloring composition of the present invention may contain the sensitizers or the light stabilizers described in paragraph 0078 of JP2004-295116A, or the thermal polymerization inhibitors described in paragraph 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and preferably controlled to 0.5 to 50 ppm.

<Method for Preparing Coloring Composition>

The coloring composition of the present invention can be prepared by mixing the above-mentioned components. The order of the components to be introduced or the operational conditions during the blending is not particularly limited. For example, the composition may be prepared by dissolving or dispersing all the components in a solvent at the same time, or by appropriately leaving the respective components in two or more solutions or dispersion liquids, and mixing them into a solution during the use (during the coating), as desired.

It is preferable that in the preparation of the coloring composition, filtration is performed using a filter for the purpose of removing foreign matters, reducing defects, or the like. As the filter, any filters that have been used in the related art for filtration use and the like may be used without particular limitation. Examples of the filter include filters formed of a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform and smooth coloring composition in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

<Color Filter>

Next, the color filter of the present invention will be described.

The color filter of the present invention is formed using the above-mentioned coloring composition of the present invention. The film thickness of the color filter of the present invention can be appropriately adjusted depending on the purposes. The film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more. The color filter of the present invention can be used for a solid-state imaging device such as a charge coupled device (CCD) and a complementary metal-oxide semiconductor (CMOS), an image display device, or the like.

<Pattern Forming Method>

The pattern forming method of the present invention includes a step of forming a coloring composition layer on a support using the coloring composition of the present invention, and a step of forming a pattern onto the coloring composition layer by a photolithographic method or a dry etching method.

Pattern formation by a photolithographic method preferably includes a step of forming a coloring composition layer on a support using the coloring composition, a step of patternwise exposing the coloring composition layer, and a step of removing unexposed areas by development to form a pattern. A step of baking the coloring composition layer (pre-baking step), and a step of baking the formed pattern (post-baking step) may be provided, as desired.

Furthermore, pattern formation by a dry etching method preferably includes a step of forming a coloring composition layer on a support using the coloring composition, a step of performing curing to form a cured product layer, a step of forming a photoresist layer on the cured product layer, a step of performing exposure and development to pattern the photoresist layer, thereby obtaining a resist pattern, and a step of dry-etching the cured product layer using the resist pattern as an etching mask to form a pattern. Hereinafter, the respective steps will be described.

<<Step of Forming Coloring Composition Layer>>

In the step of forming a curable composition layer, the coloring composition layer is formed on a support, using the coloring composition.

It is possible to use a substrate for a solid-state imaging device in which a solid-state imaging device (light-receiving element) such as a CCD and a CMOS is provided onto a substrate (for example, a silicon substrate).

The pattern in the present invention may be formed on the side (front surface) of a substrate on which a solid-state imaging device is formed, or may be formed on the side (rear surface) on which a solid-state imaging device is not formed.

An undercoat layer may be provided on the support, as desired, so as to improve adhesiveness with a layer above the support, to prevent diffusion of materials, or to make a surface of the substrate flat.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed.

In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials.

The pre-baking time is preferably 10 seconds to 300 seconds, more preferably 40 to 250 seconds, and still more preferably 80 to 220 seconds. Drying can be performed using a hot plate, an oven, or the like.

(Case of Forming Pattern by Photolithographic Method)
<<<Exposing Step>>>

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 mJ/cm$^2$, and more preferably 0.05 to 1.0 mJ/cm$^2$.

The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<<Developing Step>>>

Next, the unexposed area is removed by development to form a pattern. The removal of the unexposed area by development can be carried out using a developer. Thus, the coloring composition layer of the unexposed area in the exposing step is eluted into the developer, and as a result, only a photocured portion remains.

As the developer, an organic alkali developer causing no damage on the underlying solid-state imaging device, circuit, or the like is preferable.

The temperature of the developer is preferably for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, dimethylbis(2-hydroxyethyl)ammonium hydroxide, choline, pyrrole, piperidine, and 1,8-diazabicyclo-[5.4.0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkali may be used in a developer. As the inorganic alkali, sodium hydroxide, potassium hydroxide, sodium carbonate, sodium hydrogen carbonate, sodium silicate, sodium metasilicate, or the like is preferable.

Moreover, a surfactant may also be used in the developer. Examples of the surfactant include the surfactants described as the above-mentioned curable composition, with a nonionic surfactant being preferable.

Incidentally, in a case where a developer formed of such an aqueous alkaline solution is used, it is preferable that cleaning (rinsing) with pure water is generally performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. In addition, in a case of using an organic electroluminescence (organic EL) element as a light-emitting light source of an image display device or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher. The post-baking can be carried out continuously or batchwise by using a heating unit such as a hot plate, a convection oven (hot-air circulating dryer), and a high-frequency heater so that the film after development satisfies the conditions. Further, in a case of forming a pattern by a low-temperature process, the post-baking may not be carried out.

(Case of Forming Pattern by Dry Etching Method)

Pattern formation by a dry etching method can be carried out by curing a composition layer formed on a support to form a cured product layer, and then etching the obtained cured product layer with an etching gas, using the patterned photoresist layer as a mask.

Specifically, it is preferable that a positive tone or negative tone radiation-sensitive composition is applied onto a cured product layer, and dried to form a photoresist layer. For formation of the photoresist layer, it is preferable that a pre-baking treatment is further carried out. In particular, a process for forming a photoresist is preferably an aspect in which an post-exposure heating treatment or a post-development heating treatment (post-baking treatment) is carried out. With regard to the pattern formation by a dry etching method, reference can be made to the descriptions in paragraphs 0010 to 0067 of JP2013-064993A, the contents of which are incorporated herein by reference.

<Solid-State Imaging Device>

The solid-state imaging device of the present invention has the above-mentioned color filter of the present invention. The configuration of the solid-state imaging device of the present invention is not particularly limited as long as the solid-state imaging device is configured to include the color filter in the present invention and function as a solid-state imaging device. However, examples thereof include the following configurations.

The solid-state imaging device is configured to have a plurality of photodiodes constituting a light receiving area of the solid-state imaging device (a charge coupled device (CCD) image sensor, a complementary metal-oxide semiconductor (CMOS) image sensor, or the like), and a transfer electrode formed of polysilicon or the like on a support; have a light-shielding film having openings only over the light receiving portion of the photodiode, on the photodiodes and the transfer electrodes; have a device-protective film formed of silicon nitride or the like, which is formed to cover the entire surface of the light-shielding film and the light receiving portion of the photodiodes, on the light-shielding film; and have a color filter on the device-protective film. In addition, the solid-state imaging device may also be configured, for example, such that it has a light collecting means (for example, a microlens, which is the same hereinafter) on a device-protective film under a color filter (a side closer to the support), or has a light-collecting means on a color filter.

<Image Display Device>

The color filter of the present invention can be used for an image display device such as a liquid crystal display device and an organic electroluminescence display device. The definitions of display devices and the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989) ", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the specific Examples shown below. In addition, "parts" and "%" are on a mass basis unless otherwise specified.

<Measurement of Weight-Average Molecular Weight>

The weight-average molecular weight was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene

<Preparation of Coloring Composition>

Example 101

A mixed liquid including 30.72 parts of a compound a11, 10.8 parts of a resin A, and 120 parts of propylene glycol methyl ether acetate (PGMEA) was mixed and dispersed by a bead mill (zirconia beads with a diameter of 0.3 mm) for 3 hours to prepare a pigment dispersion liquid. To the obtained pigment dispersion liquid was added 0.60 parts of a phthalimide compound (FE-1) to produce a coloring composition of Example 101.

Examples 102 to 104

By the same method as in Example 101, except that each of compounds a12 to 14 was used instead of the compound a11 in Example 101, each of coloring compositions of Example 102 to 104 was produced.

Example 105

To a mixed liquid including 30.72 parts of a compound a21, 10.8 parts of the resin A, and 120 parts of PGMEA was added 0.60 parts of the phthalimide compound (FE-1) to produce a coloring composition of Example 105.

Examples 106 to 108

By the same method as in Example 105, except that each of compounds a31, a41, and a51 was used instead of the compound a21 in Example 105, each of coloring compositions of Examples 106 to 108 was produced.

(Example 201)

Production of Dispersion Liquid Y1

A mixed liquid including 30.72 parts of the compound a11, 10.8 parts of the resin A, and 120 parts of PGMEA was mixed and dispersed by a bead mill (zirconia beads having a diameter of 0.3 mm) for 3 hours to produce a dispersion liquid Y1.

Production of Dispersion Liquid G

A mixed liquid including 30.72 parts of a green pigment G1, 10.8 parts of the resin A, and 120 parts of PGMEA was mixed and dispersed by a bead mill (zirconia beads having a diameter of 0.3 mm) for 3 hours to produce a dispersion liquid G1.

Production of Coloring Composition

The following components were mixed to produce a coloring composition of Example 201.

Dispersion liquid Y1: 51 parts

Dispersion liquid G1: 110 parts

Resin B: 36 parts
Curable compound (M-1): 33 parts
Photopolymerization initiator (I-1): 9.92 parts
p-Methoxyphenol: 0.04 parts
PGMEA: 160 parts
Phthalimide compound (FE-1): 0.2 parts Examples 202 to 204

In the same manner as for the dispersion liquid Y1, except that each of compounds a12 to a14 was used instead of the compound a11 in Example 201, each of dispersion liquids Y2 to Y4 was produced.

In the same manner as in Example 201, except that each of the dispersion liquids Y2 to Y4 was used instead of the dispersion liquid Y1 in Example 201, each of coloring compositions of Examples 202 to 204 was produced.

(Example 205)
Production of Mixed Liquid 1

30.72 parts of the compound a21, 10.8 parts of the resin A, and 120 parts of PGMEA were mixed to produce a mixed liquid 1.

Production of Coloring Composition
The following components were mixed to produce a coloring composition of Example 205.
Mixed liquid 1: 51 parts
Dispersion liquid G1: 110 parts
Resin B: 36 parts
Curable compound (M-1): 33 parts
Photopolymerization initiator (1-1): 9.92 parts
p-Methoxyphenol: 0.04 parts
PGMEA: 160 parts
Phthalimide compound (FE-1): 0.2 parts Examples 206 to 208

In the same manner as for the mixed liquid 1, except that a compound a31, a41, or a51 was used instead of the compound a21 in Example 205, each of mixed liquids 2 to 4 was produced.

In the same manner as in Example 205, except that each of the mixed liquids 2 to 4 was used instead of the mixed liquid 1 in Example 205, each of coloring compositions of Examples 206 to 208 was produced.

Examples 301 to 308

In the same manner as Examples 201 to 208, except that 2-methoxy-1-propylacetate was contained in the amount of 0.1% by mass with respect to the mass of the coloring composition in Examples 201 to 208, coloring compositions of Examples 301 to 308 were produced.

Example 309

In the same manner as in Example 301, except that the photopolymerization initiator (1-1) was changed to the same mass of a photopolymerization initiator (1-2) in Example 301, a coloring composition of Example 309 was produced.

Examples 401 to 404

A mixed liquid including 30.72 parts of a green pigment G2, 10.8 parts of the resin A, and 120 parts of PGMEA was mixed and dispersed by a bead mill (zirconia beads having a diameter of 0.3 mm) for 3 hours to produce a dispersion liquid G2.

In the same manner as in Examples 201 to 204, except that a dispersion liquid G2 was used instead of the dispersion liquid G1 in Examples 201 to 204, coloring compositions of Examples 401 to 404 were produced.

Example 405

In the same manner as in Example 401, except that the photopolymerization initiator (1-1) was changed to the same mass of the photopolymerization initiator (1-2) in Example 401, a coloring composition of Example 405 was produced.

Examples 502 to 508

In the same manner as in Example 201, except that each of phthalimide compounds (FE-2) to (FE-8) was used instead of the phthalimide compound (FE-1) in Example 201, each of coloring compositions of Examples 502 to 508 was produced.

Examples 602 to 607

In the same manner as in Example 201, except that the blend amount of the phthalimide compound (FE-1) was changed to each of the blend amounts shown in the following table in Example 201, each of coloring compositions of Examples 602 to 608 was produced.

Examples 702 to 707

In the same manner as in Example 301, except that the content of the 2-methoxy-1-propylacetate was changed to each of the proportions shown in the following table in Example 301, each of coloring compositions of Examples 702 to 707 was produced.

Comparative Examples 1, and 9 to 15

In the same manner as in Examples 101 to 108, except that the phthalimide compound was not used in Examples 101 to 108, coloring compositions of Comparative Examples 1, and 9 to 15 were produced.

Comparative Examples 2 to 5

In the same manner as in Example 101, except that each of compounds b11 to b14 was used instead of the compound a11 in Example 101, each of the coloring compositions of Comparative Examples 2 to 5 was produced.

Comparative Examples 6 to 8

In the same manner as in Examples 105 to 107, except that each of compounds b21, b31, and b41 was used instead of each of the compounds a21, a31, and a41 in Examples 105 to 107, each of the coloring compositions of Comparative Examples 6 to 8 was produced.

<Evaluation Method>

Each of the coloring compositions was put into a sealed container and subjected to a 150-day temperature cycle test under 5° C. for 4 hours and at 25° C. for 2 hours, and the colored composition was then taken from the sealed container. The colored composition was applied onto a glass wafer using a spin coater such that the film thickness after drying became 0.5 m, and subjected to a heating treatment (pre-baked) using a hot plate at 100° C. for 180 seconds, thereby producing a coating film for evaluation.

A 0.5-mm$^2$ area of the coating film on the glass wafer was observed with the naked eye using an optical microscope at a magnification of 100 times, the number of defects on the membrane surface was counted, and the defects were evaluated in accordance with the following standard.

TABLE 1

| Evaluation | Evaluation standard |
|---|---|
| 1 | The number of defects is 50 or more, which is not acceptable |
| 2 | The number of defects is 25 to 49, which is not acceptable |
| 3 | The number of defects is 11 to 24, which is acceptable |
| 4 | The number of defects is 6 to 10, which is acceptable |
| 5 | The number of defects is 1 to 5, which is acceptable |
| 6 | No defects are found in a view for evaluation. |

TABLE 2

| | Compound | Phthalimide compound | Solvent | Green pigment | 2-Methoxy-1-propylacetate (% by mass) | Photopolymerization initiator | Evaluation |
|---|---|---|---|---|---|---|---|
| Example 101 | a11 | FE-1 | PGMEA | — | — | — | 4 |
| Example 102 | a12 | FE-1 | PGMEA | — | — | — | 4 |
| Example 103 | a13 | FE-1 | PGMEA | — | — | — | 4 |
| Example 104 | a14 | FE-1 | PGMEA | — | — | — | 4 |
| Example 105 | a21 | FE-1 | PGMEA | — | — | — | 3 |
| Example 106 | a31 | FE-1 | PGMEA | — | — | — | 3 |
| Example 107 | a41 | FE-1 | PGMEA | — | — | — | 3 |
| Example 108 | a51 | FE-1 | PGMEA | — | — | — | 3 |
| Example 201 | a11 | FE-1 | PGMEA | G1 | — | I-1 | 5 |
| Example 202 | a12 | FE-1 | PGMEA | G1 | — | I-1 | 5 |
| Example 203 | a13 | FE-1 | PGMEA | G1 | — | I-1 | 5 |
| Example 204 | a14 | FE-1 | PGMEA | G1 | — | I-1 | 5 |
| Example 205 | a21 | FE-1 | PGMEA | G1 | — | I-1 | 4 |
| Example 206 | a31 | FE-1 | PGMEA | G1 | — | I-1 | 4 |
| Example 207 | a41 | FE-1 | PGMEA | G1 | — | I-1 | 4 |
| Example 208 | a51 | FE-1 | PGMEA | G1 | — | I-1 | 4 |
| Example 301 | a11 | FE-1 | PGMEA | G1 | 0.1% by mass | I-1 | 6 |
| Example 302 | a12 | FE-1 | PGMEA | G1 | 0.1% by mass | I-1 | 6 |
| Example 303 | a13 | FE-1 | PGMEA | G1 | 0.1% by mass | I-1 | 6 |
| Example 304 | a14 | FE-1 | PGMEA | G1 | 0.1% by mass | I-1 | 6 |
| Example 305 | a21 | FE-1 | PGMEA | G1 | 0.1% by mass | I-1 | 4 |
| Example 306 | a31 | FE-1 | PGMEA | G1 | 0.1% by mass | I-1 | 4 |
| Example 307 | a41 | FE-1 | PGMEA | G1 | 0.1% by mass | I-1 | 4 |
| Example 308 | a51 | FE-1 | PGMEA | G1 | 0.1% by mass | I-1 | 4 |
| Example 309 | a11 | FE-1 | PGMEA | G1 | 0.1% by mass | I-2 | 6 |
| Example 401 | a11 | FE-1 | PGMEA | G2 | — | I-1 | 6 |
| Example 402 | a12 | FE-1 | PGMEA | G2 | — | I-1 | 6 |
| Example 403 | a13 | FE-1 | PGMEA | G2 | — | I-1 | 6 |
| Example 404 | a14 | FE-1 | PGMEA | G2 | — | I-1 | 6 |
| Example 405 | a11 | FE-1 | PGMEA | G2 | — | I-2 | 6 |

TABLE 3

| | Compound | Phthalimide compound | Solvent | Green pigment | 2-Methoxy-1-propylacetate (% by mass) | Photopolymerization initiator | Evaluation |
|---|---|---|---|---|---|---|---|
| Example 201 | a11 | FE-1 | PGMEA | G1 | — | I-1 | 5 |
| Example 502 | a11 | FE-2 | PGMEA | G1 | — | I-1 | 4 |
| Example 503 | a11 | FE-3 | PGMEA | G1 | — | I-1 | 4 |
| Example 504 | a11 | FE-4 | PGMEA | G1 | — | I-1 | 4 |
| Example 505 | a11 | FE-5 | PGMEA | G1 | — | I-1 | 4 |
| Example 506 | a11 | FE-6 | PGMEA | G1 | — | I-1 | 4 |
| Example 507 | a11 | FE-7 | PGMEA | G1 | — | I-1 | 4 |
| Example 508 | a11 | FE-8 | PGMEA | G1 | — | I-1 | 4 |

TABLE 4

| | Compound | Blend amount (parts) of phthalimide compound (FE-1) | Solvent | Green pigment | 2-Methoxy-1-propylacetate (% by mass) | Photopolymerization initiator | Evaluation |
|---|---|---|---|---|---|---|---|
| Example 201 | a11 | 0.2 | PGMEA | G1 | — | I-1 | 5 |
| Example 602 | a11 | 0.01 | PGMEA | G1 | — | I-1 | 4 |

TABLE 4-continued

| | Compound | Blend amount (parts) of phthalimide compund (FE-1) | Solvent | Green pigment | 2-Methoxy-1-propylacetate (% by mass) | Photopoly-merization initiator | Evaluation |
|---|---|---|---|---|---|---|---|
| Example 603 | a11 | 0.1 | PGMEA | G1 | — | I-1 | 4 |
| Example 604 | a11 | 0.5 | PGMEA | G1 | — | I-1 | 5 |
| Example 605 | a11 | 1 | PGMEA | G1 | — | I-1 | 4 |
| Example 606 | a11 | 1.5 | PGMEA | G1 | — | I-1 | 4 |
| Example 607 | a11 | 2 | PGMEA | G1 | — | I-1 | 4 |

TABLE 5

| | Compound | Phthalimide compound | Solvent | Green pigment | 2-Methoxy-1-propylacetate (% by mass) | Photopoly-merization initiator | Evaluation |
|---|---|---|---|---|---|---|---|
| Example 301 | a11 | FE-1 | PGMEA | G1 | 0.1% by mass | I-1 | 6 |
| Example 702 | a11 | FE-1 | PGMEA | G1 | 0.01% by mass | I-1 | 6 |
| Example 703 | a11 | FE-1 | PGMEA | G1 | 0.005% by mass | I-1 | 6 |
| Example 704 | a11 | FE-1 | PGMEA | G1 | 0.2% by mass | I-1 | 6 |
| Example 705 | a11 | FE-1 | PGMEA | G1 | 0.4% by mass | I-1 | 6 |
| Example 706 | a11 | FE-1 | PGMEA | G1 | 1.0% by mass | I-1 | 6 |
| Example 707 | a11 | FE-1 | PGMEA | G1 | 1.5% by mass | I-1 | 6 |

TABLE 6

| | Compound | Phthalimide compound | Solvent | Green pigment | 2-Methoxy-1-propylacetate (% by mass) | Photopoly-merization initiator | Evaluation |
|---|---|---|---|---|---|---|---|
| Comparative Example 1 | a11 | None | PGMEA | — | — | — | 1 |
| Comparative Example 2 | b11 | FE-1 | PGMEA | — | — | — | 1 |
| Comparative Example 3 | b12 | FE-1 | PGMEA | — | — | — | 1 |
| Comparative Example 4 | b13 | FE-1 | PGMEA | — | — | — | 1 |
| Comparative Example: 5 | b14 | FE-1 | PGMEA | — | — | — | 1 |
| Comparative Example 6 | b21 | FE-1 | PGMEA | — | — | — | 1 |
| Comparative Example 7 | b31 | FE-1 | PGMEA | — | — | — | 1 |
| Comparative Example 8 | b41 | FE-1 | PGMEA | — | — | — | 1 |
| Comparative Example 9 | a12 | None | PGMEA | — | — | — | 1 |
| Comparative Example 10 | a13 | None | PGMEA | — | — | — | 1 |
| Comparative Example 11 | a14 | None | PGMEA | — | — | — | 1 |
| Comparative Example 12 | a21 | None | PGMEA | — | — | — | 1 |
| Comparative Example 13 | a31 | None | PGMEA | — | — | — | 1 |
| Comparative Example 14 | a41 | None | PGMEA | — | — | — | 1 |
| Comparative Example 15 | a51 | None | PGMEA | — | — | — | 1 |

From the results, the coloring compositions of Examples were capable of producing a film having fewer defects generated, even in a case where the coloring compositions were stored for a long period of time in an environment with variations in temperature.

In contrast, the films using the coloring compositions of Comparative Examples had many defects.

In addition, the coating films of Examples 101, 201, 301, and 401, and Comparative Example 1 were stored in an environment at 25° C. for 3 days. Then, 0.5-mm² areas of the coating films were observed with the naked eye at a magnification of 100 times using an optical microscope, the number of defects on the membrane surface was counted, and the defects after the coating films had been delayed and left to stand were evaluated. As a result, the sample of Comparative Example 1 had a further increase in the number of defects, as compared with a case where the coating films were not delayed and left to stand. In contrast, the samples of Examples 101, 201, 301, and 401 did not show a further increase in the number of defects even after the coating films had been delayed and left to stand, and thus, it could be seen that the performance of "being delayed and left to stand" was improved.

The compounds in Examples and Comparative Examples are as follows. Further, Me in the following structural formulae represents a methyl group.

(Yellow Coloring Agent)

Compounds a11 to a14, a21, a31, a41, and a51: The following structures a11

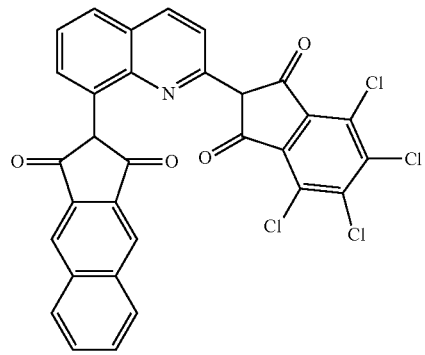

a12

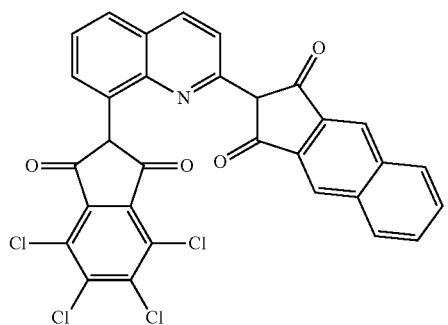

-continued a13

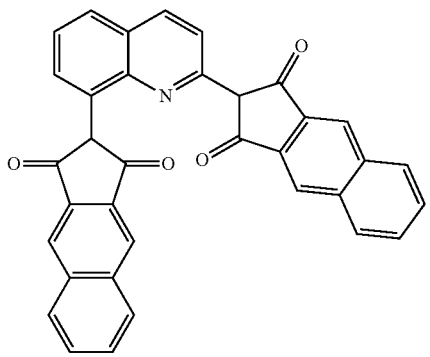

a14

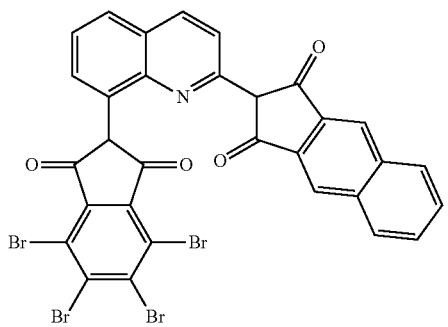

a21

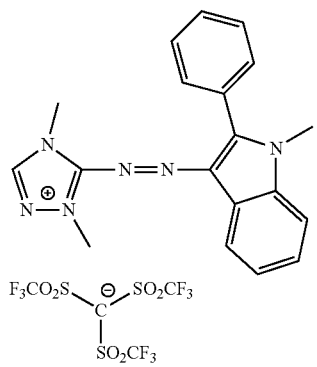

a31

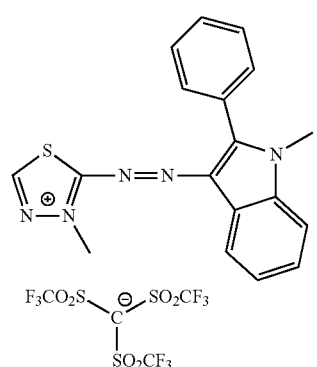

a41

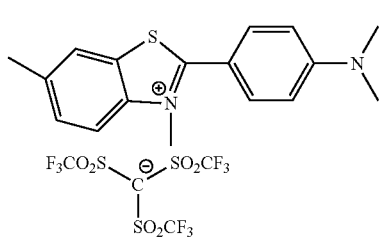

a51

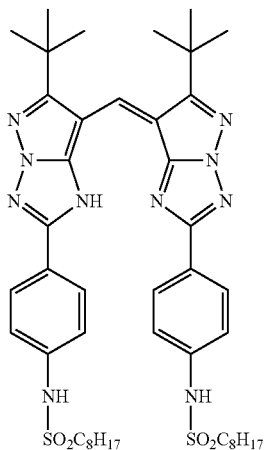

b14

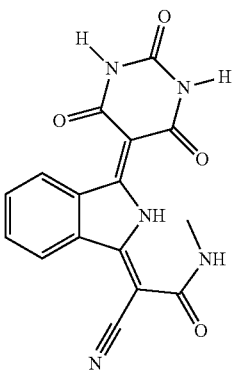

Compounds b11 to b14, b21, b31, and b41: The following structures. M in b11 is Na. The compound b13 is C. I. Pigment Yellow 150 and the compound b14 is C. I. Pigment Yellow 185.

b11

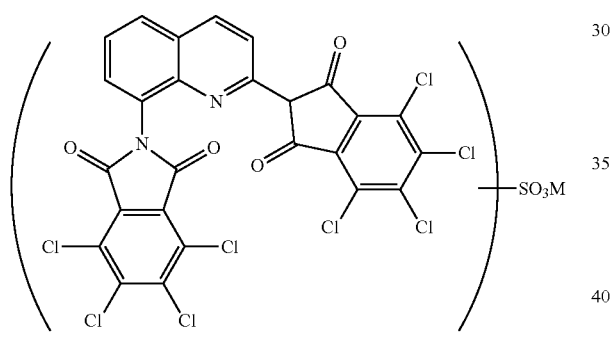

b21

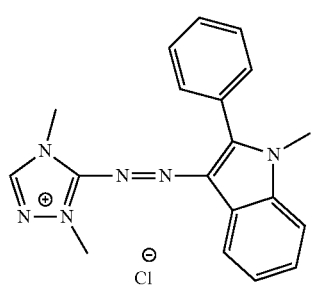

b12

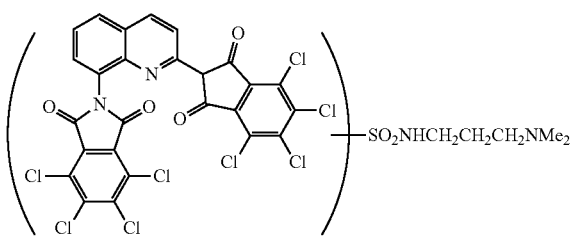

Nickel complex of b13

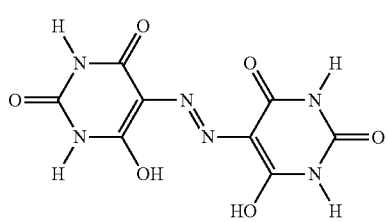

b31

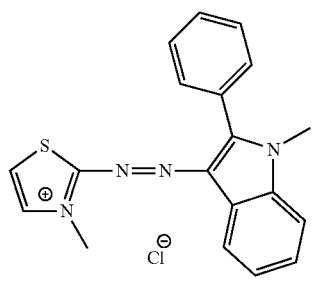

b41

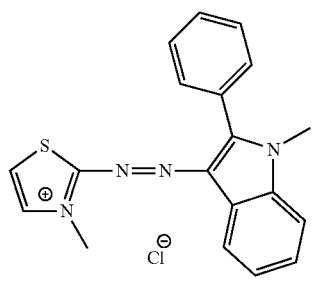

(Green Pigment)

G1: A compound of Formula A1, in which in $X^1$ to $X^{16}$, the average number of bromine atoms is 12 and the average number of chlorine atoms is 4.

G2: A compound of Formula A1, in which in $X^1$ to $X^{16}$, the average number of bromine atoms is 9, the average number of chlorine atoms is 3, and the average number of hydrogen atoms is 4.

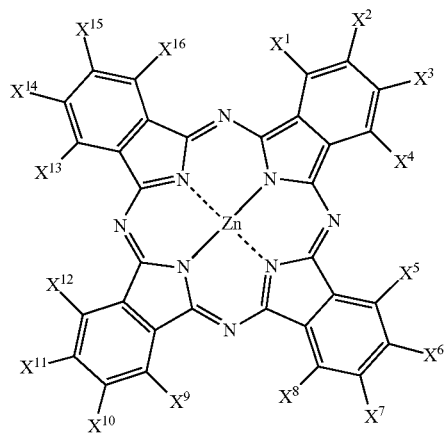

(A1)

(Phthalimide Compound)

FE-1: A compound in which all of $A^1$ to $A^4$ in Formula PI are bromine atoms

FE-2: A compound in which all of $A^1$ to $A^4$ in Formula PI are chlorine atoms FE-3: A compound in which two of $A^1$ to $A^4$ in Formula PI are bromine atoms, and the others are chlorine atoms FE-4: A compound in which two of $A^1$ to $A^4$ in Formula PI are bromine atoms, and the others are hydrogen atoms FE-5: A compound in which two of $A^1$ to $A^4$ in Formula PI are bromine atoms, another is a chlorine atom, and the other is a hydrogen atom FE-6: A compound in which all of $A^1$ to $A^4$ in Formula PI are hydrogen atoms FE-7: A compound in which all of $A^1$ to $A^4$ in Formula PT are methyl groups FE-8: A compound in which all of $A^1$ to $A^4$ in Formula PI are n-butyl groups

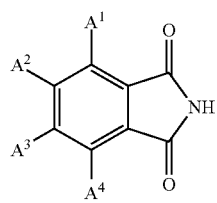

(PI)

(Resin)

Resin A: The following structure (the numerical values shown together with the respective repeating units (the numerical values shown together with the repeating units in the main chain) represent the contents [% by mass] of the respective repeating units; and the numerical values shown together with the repeating sites in the side chain represent repetition numbers of the repeating sites). Acid value=50 mgKOH/g, Mw=24,000

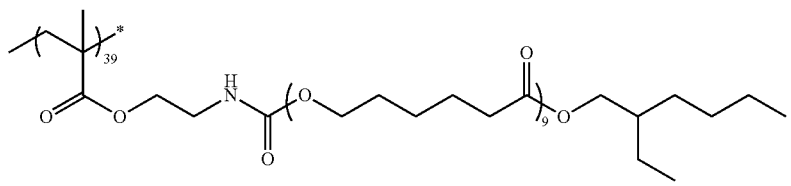

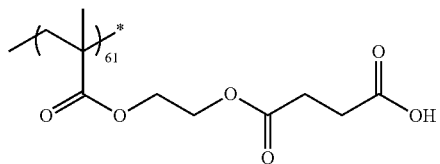

Resin B: The following structure (the numerical values shown together with the respective repeating units (the numerical values shown together with the repeating units in the main chain) represent the contents [% by mass] of the respective repeating units). Acid value=70 mgKOH/g, Mw=11,000

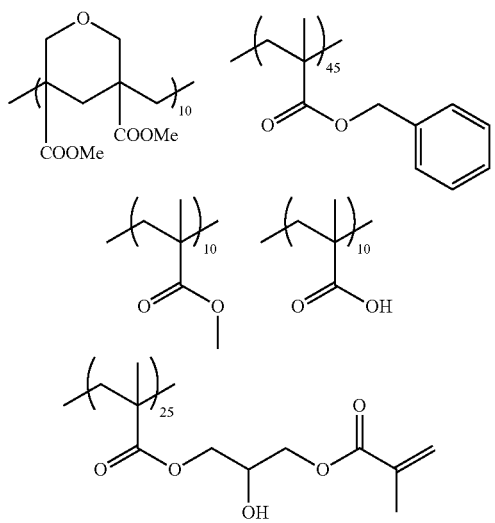

(Curable Compound)
M-1: The following structure

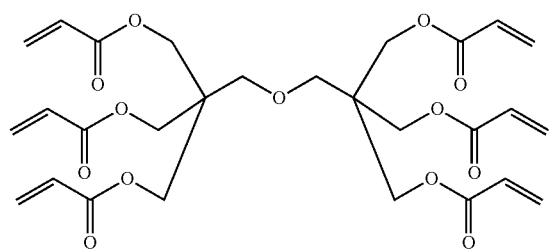 [SMILES: C=CC(=O)OCC(COCC(COC(=O)C=C)(COC(=O)C=C)COC(=O)C=C)(COC(=O)C=C)COC(=O)C=C]

(Photopolymerization Initiator)
I-1: The following structure

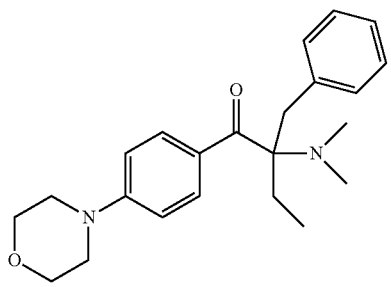 [SMILES: CCC(Cc1ccccc1)(C(=O)c1ccc(N2CCOCC2)cc1)N(C)C]

I-2: IRGACURE-OXE01 (Manufactured by BASF)

What is claimed is:

1. A coloring composition comprising:
a heterocycle-containing coloring agent including a nitrogen atom;
a phthalimide compound;
a solvent; and
a resin,
wherein the heterocycle-containing coloring agent is at least one selected from Formulae (1) to (4),

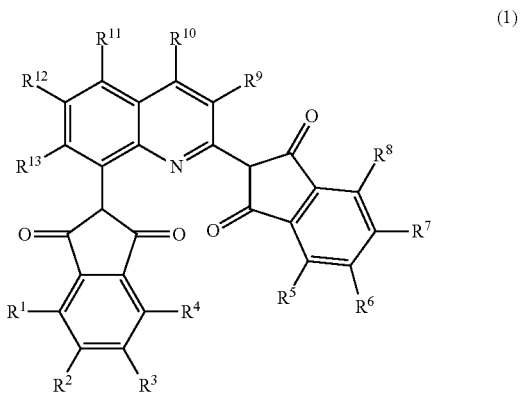

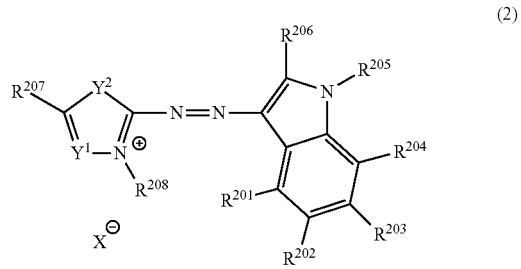

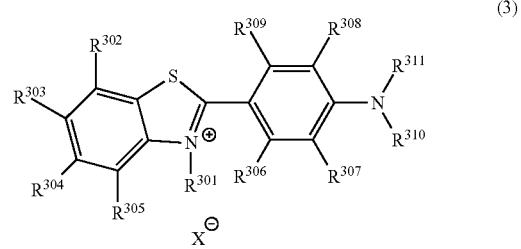

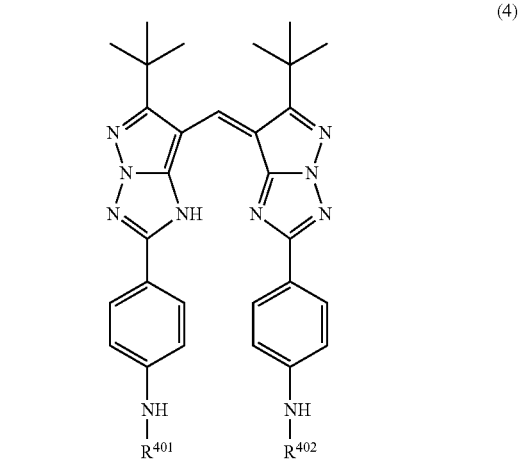

in Formula (1), $R^1$ to $R^{13}$ each independently represent a hydrogen atom or a substituent, and adjacent groups of $R^1$ to $R^8$ may be bonded to each other to form a ring, provided that, in at least one of pairs of adjacent two groups of $R^1$ to $R^8$, the adjacent two groups of $R^1$ to $R^8$ is bonded to each other to form an aromatic ring;

in Formula (2), $R^{205}$ and $R^{208}$ each independently represent a hydrogen atom, an alkyl group, an aryl group, or a heteroaryl group, $R^{201}$ to $R^{204}$, $R^{206}$, and $R^{207}$ each independently represent a hydrogen atom or a substituent, $Y^1$ represents a nitrogen atom or —$CR^{Y1}$—, $Y^2$ represents a sulfur atom or —$NR^{Y2}$—, $R^{Y1}$ and $R^{Y2}$ each independently represent a hydrogen atom, an alkyl group, an aryl group, or a heteroaryl group, and X represents a bis(sulfonyl)imide anion, a tris(sulfonyl)methide anion, or an anion having a boron atom;

in Formula (3), $R^{301}$, $R^{311}$, and $R^{310}$ each independently represent a hydrogen atom, an alkyl group, an aryl group, or a heteroaryl group, and $R^{302}$ to $R^{305}$, and $R^{306}$ to $R^{309}$ each independently represent a hydrogen atom or a substituent, and X represents a bis(sulfonyl)imide anion, a tris(sulfonyl)methide anion, or an anion having a boron atom; and in Formula (4), $R^{401}$ and $R^{402}$ each independently represent $SO_2R^{403}$ or $COR^{403}$, and $R^{403}$ represents an alkyl group, an aryl group, or a heteroaryl group.

2. The coloring composition according to claim 1, wherein the phthalimide compound is a compound represented by Formula (PI),

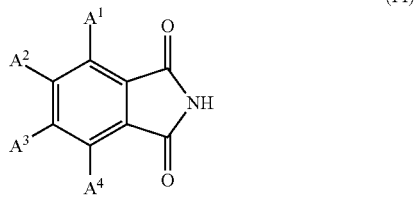

in Formula (PI), $A^1$ to $A^4$ each independently represent a hydrogen atom, a halogen atom, or an alkyl group.

3. The coloring composition according to claim 2, Wherein, in the phthalimide compound, at least one of $A^1$ to $A^4$ in Formula (PI) is a bromine atom.

4. The coloring composition according to claim 1, wherein the phthalimide compound is contained in a proportion of 0.001 to 6.0 parts by mass with respect to 100 parts by mass of the total amount of the compounds represented by Formulae (1) to (4).

5. The coloring composition according to claim 1, further comprising a curable compound.

6. The coloring composition according to claim 5, which further comprises a photopolymerization initiator; and wherein the curable compound includes a radically polymerizable compound.

7. A color filter using the coloring composition according to claim 1.

8. A solid-state imaging device comprising the color filter according to claim 7.

9. An image display device comprising the color filter according to claim 7.

10. A pattern forming method comprising:

forming a coloring composition layer on a support using the coloring composition according to claim 1; and forming a pattern onto the coloring composition layer by a photolithographic method or a dry etching method.

* * * * *